United States Patent
Koshizawa et al.

(10) Patent No.: US 12,183,578 B2
(45) Date of Patent: Dec. 31, 2024

(54) METHOD FOR FORMING AND PATTERNING A LAYER AND/OR SUBSTRATE

(71) Applicant: Applied Materials, Inc., Santa Clara, CA (US)

(72) Inventors: Takehito Koshizawa, San Jose, CA (US); Rui Cheng, Santa Clara, CA (US); Tejinder Singh, San Jose, CA (US); Hidetaka Oshio, Tokyo (JP)

(73) Assignee: Applied Materials, Inc., Santa Clara, CA (US)

( * ) Notice: Subject to any disclaimer, the term of this patent is extended or adjusted under 35 U.S.C. 154(b) by 521 days.

(21) Appl. No.: 17/459,839

(22) Filed: Aug. 27, 2021

(65) Prior Publication Data
US 2022/0013359 A1   Jan. 13, 2022

Related U.S. Application Data

(63) Continuation of application No. 16/853,500, filed on Apr. 20, 2020, now Pat. No. 11,145,509.
(Continued)

(51) Int. Cl.
*H01L 21/033*  (2006.01)
*H01L 21/311*  (2006.01)
(Continued)

(52) U.S. Cl.
CPC ...... *H01L 21/0337* (2013.01); *H01L 21/0332* (2013.01); *H01L 21/31144* (2013.01);
(Continued)

(58) Field of Classification Search
None
See application file for complete search history.

(56) References Cited

U.S. PATENT DOCUMENTS

| | | | |
|---|---|---|---|
| 4,645,977 A | 2/1987 | Kurokawa et al. | |
| 5,098,737 A | 3/1992 | Collins et al. | |

(Continued)

FOREIGN PATENT DOCUMENTS

| | | | |
|---|---|---|---|
| CN | 101405216 A | 4/2009 | |
| CN | 105895510 A | 8/2016 | |

(Continued)

OTHER PUBLICATIONS

M. Ban, Diamond-like carbon films deposited by electron beam excited plasma chemical vapor deposition, Diamond and Related Materials 11 (2002) 1353-1359.

(Continued)

*Primary Examiner* — Roberts P Culbert
(74) *Attorney, Agent, or Firm* — Patterson + Sheridan, LLP

(57) ABSTRACT

In an embodiment, a method for forming features for semiconductor processing. A first mandrel and a second mandrel are formed on a substrate. A first spacer is formed along a first sidewall of the first mandrel, and a second spacer is formed along a second sidewall of the second mandrel. A gap is defined between the first spacer and the second spacer. The gap is filled by a gap-filling material. In some examples, the gap-filling material includes a doped silicon material. In some examples, the first spacer and the second spacer each include a doped silicon material.

19 Claims, 14 Drawing Sheets

Related U.S. Application Data

(60) Provisional application No. 62/852,944, filed on May 24, 2019.

(51) Int. Cl.
    *H01L 21/3213*     (2006.01)
    *H01L 21/768*     (2006.01)

(52) U.S. Cl.
    CPC ... *H01L 21/31111* (2013.01); *H01L 21/32134* (2013.01); *H01L 21/76831* (2013.01)

(56) References Cited

U.S. PATENT DOCUMENTS

| | | |
|---|---|---|
| 5,389,570 A | 2/1995 | Shiozawa |
| 5,569,501 A | 10/1996 | Bailey et al. |
| 5,863,598 A | 1/1999 | Venkatesan et al. |
| 5,942,854 A | 8/1999 | Ryoji et al. |
| 6,197,669 B1 | 3/2001 | Twu et al. |
| 6,342,421 B1 | 1/2002 | Mitani et al. |
| 6,410,090 B1 | 6/2002 | Wang |
| 6,572,935 B1 | 6/2003 | He et al. |
| 6,592,771 B1 | 7/2003 | Yamanaka et al. |
| 7,166,336 B1 | 1/2007 | Mori et al. |
| 7,368,390 B2 | 5/2008 | Czech et al. |
| 7,604,834 B2 | 10/2009 | Ravi |
| 8,105,660 B2 | 1/2012 | Tudhope et al. |
| 8,669,181 B1 | 3/2014 | Yu et al. |
| 8,999,848 B2 | 4/2015 | Lee et al. |
| 9,123,776 B2 | 9/2015 | Tsai et al. |
| 9,177,797 B2 | 11/2015 | Chang et al. |
| 9,548,201 B2 | 1/2017 | Zhang et al. |
| 9,818,613 B1 | 11/2017 | Huang et al. |
| 9,892,917 B2 | 2/2018 | Swaminathan et al. |
| 9,911,611 B2 | 3/2018 | Yen et al. |
| 10,074,534 B2 | 9/2018 | Behera et al. |
| 10,276,381 B2 | 4/2019 | Su |
| 10,446,394 B2 | 10/2019 | Abatchev et al. |
| 10,510,540 B2 | 12/2019 | Zhang et al. |
| 10,546,748 B2 | 1/2020 | Yu et al. |
| 2009/0029067 A1 | 1/2009 | Sciamanna et al. |
| 2009/0286402 A1* | 11/2009 | Xia ........... H01L 21/318 257/E21.249 |
| 2010/0275995 A1 | 11/2010 | Kaes et al. |
| 2011/0021010 A1 | 1/2011 | Cheng et al. |
| 2014/0170853 A1 | 6/2014 | Shamma et al. |
| 2014/0248754 A1* | 9/2014 | Thadani ........... H01L 21/7682 438/422 |
| 2014/0349490 A1 | 11/2014 | Kim et al. |
| 2015/0099367 A1 | 4/2015 | Kim et al. |
| 2015/0108619 A1 | 4/2015 | Nemani |
| 2015/0155198 A1 | 6/2015 | Tsai et al. |
| 2015/0364603 A1* | 12/2015 | Cheng ........... H01L 29/42392 257/192 |
| 2016/0300920 A1 | 10/2016 | Schulze et al. |
| 2016/0365274 A1 | 12/2016 | Choi et al. |
| 2017/0194147 A1 | 7/2017 | Lin et al. |
| 2017/0236716 A1 | 8/2017 | Chen et al. |
| 2017/0263548 A1 | 9/2017 | Chen et al. |
| 2017/0263553 A1* | 9/2017 | Schenker ........ H01L 21/76808 |
| 2017/0301552 A1 | 10/2017 | deVilliers |
| 2018/0138040 A1 | 5/2018 | LaVoie |
| 2018/0315601 A1 | 11/2018 | Peng et al. |
| 2018/0315602 A1 | 11/2018 | Tseng et al. |
| 2018/0323061 A1 | 11/2018 | Raley et al. |
| 2019/0123138 A1* | 4/2019 | Leobandung ........ H01L 29/413 |
| 2019/0385917 A1* | 12/2019 | Lee ............... H01L 21/823878 |
| 2020/0194450 A1* | 6/2020 | Pachamuthu ..... H01L 21/76877 |

FOREIGN PATENT DOCUMENTS

| | | |
|---|---|---|
| CN | 109216166 A | 1/2019 |
| CN | 109427656 A | 3/2019 |
| JP | 4193017 B2 | 12/2008 |
| JP | 2008546186 A | 12/2008 |
| JP | 2012009860 A | 1/2012 |
| JP | 2018085504 A | 5/2018 |

OTHER PUBLICATIONS

International Search Report and Written Opinion Application No. PCT/US2020/029073 dated Jul. 31, 2020 consists of 9 pages.

Japanese Office Action for Application No. 2021-569896 dated Apr. 2, 2024.

Y. Kuo et al., Boron-doped a-Si:H Thin Film Deposition Process and Applications in p-channel Thin Film Transistor and Photodiode for He—Ne Laser Light Detection, 2002.

H. Nominanda, Process and Material Properties of PECVD Boron-Doped Amorphous Silicon Film, Publication Date Unknown, <https://www.electrochem.org/dl/ma/201/pdfs/0399.pdf>.

Handbook of Thin Film Deposition, p. 261 (section 8.7.1), available on Google Books.

A. Jacob., Scaling challenges for Advanced CMOS Devices, Mar. 2017, <https://www.researchgate.net/figure/a-Simulation-images-of-the-stages-of-self-aligned-quadruple-patterning-SAQP-from_fig39_313845174>.

A. Raley, A spacer-on-spacer scheme for self-aligned multiple patterning and integration, Aug. 2016, <https://spie.org/news/6583-a-spacer-on-spacer-scheme-for-self-aligned-multiple-patterning-and-integration>.

N. Mohanty et al., Semiconductor scaling via self-aligned block patterning, Mar. 17, 2017, <https://spie.org/news/6587-semiconductor-scaling-via-self-aligned-block-patterning?SSO=1>.

A. Grill, Plasma-deposited diamondlike carbon and related materials, IBM J. of Res. & Dev. (vol. 43, Issue 1.2, Jan. 1999), <https://ieeexplore.ieee.org/document/5389254>.

A.P. Mousinho, High density plasma chemical vapor deposition of diamond-like carbon films, Microelect. J. (2003) 627-629.

M. Ban, Stress and structural properties of diamond-like carbon films deposited by electron beam excited plasma CVD, Diamond and Related Materials 12 (2003) 47-56.

Chinese Office Action for Application No. 202080032737.5 dated Jul. 16, 2024.

\* cited by examiner

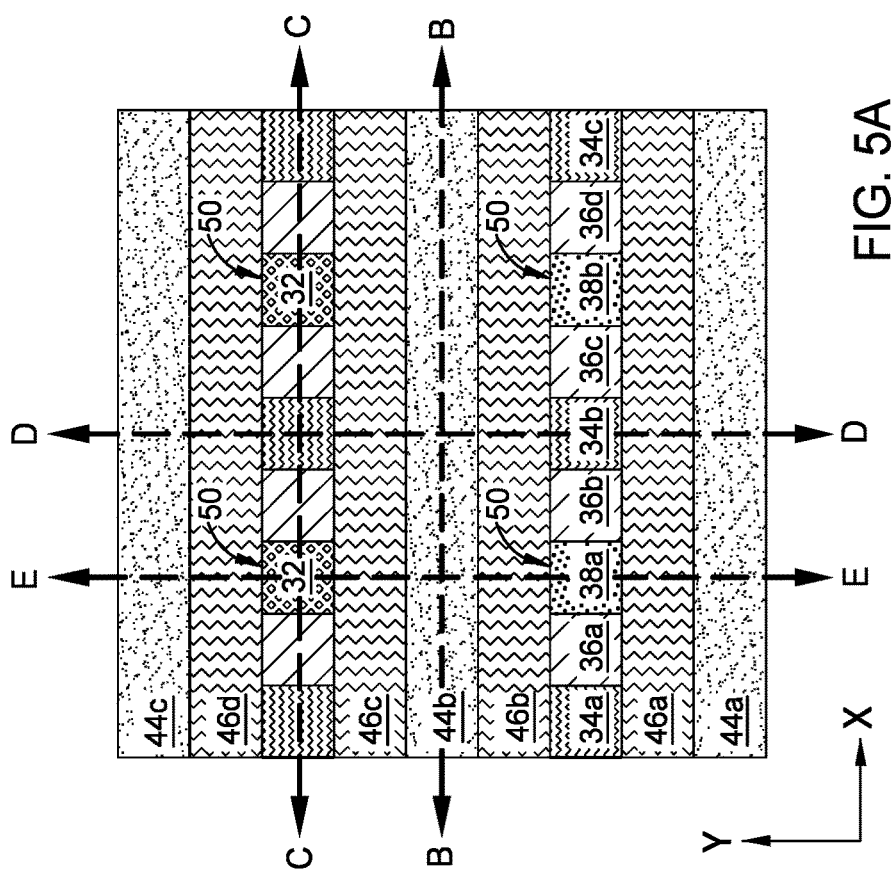
FIG. 5A
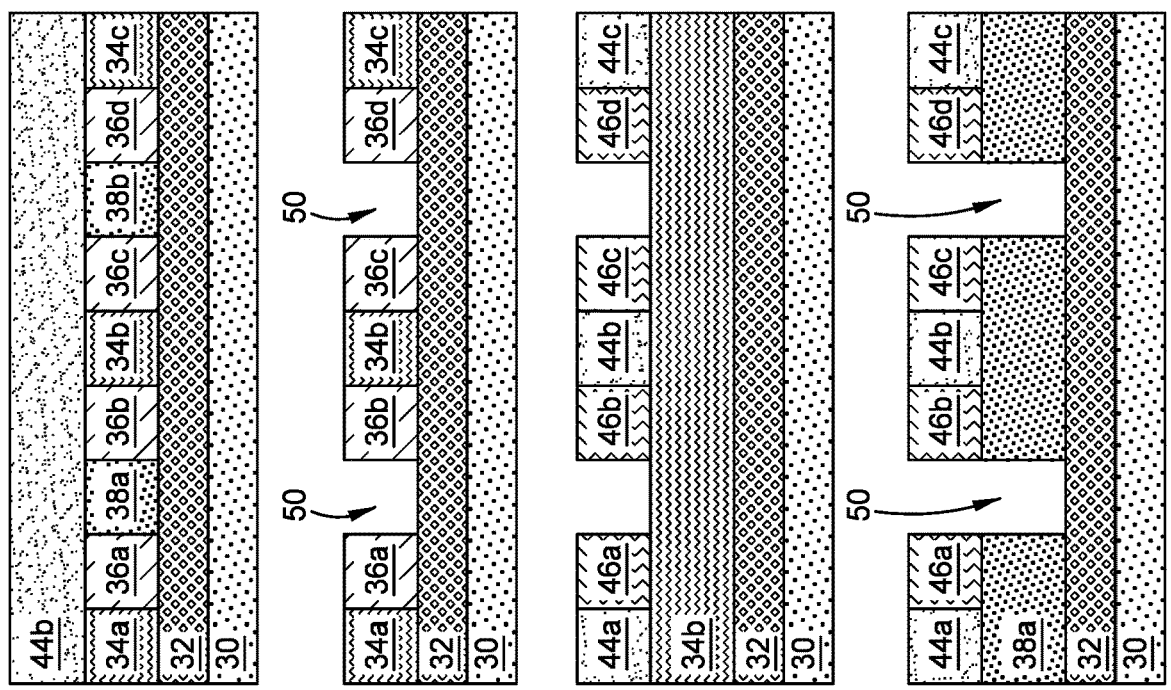
FIG. 5B
FIG. 5C
FIG. 5D
FIG. 5E

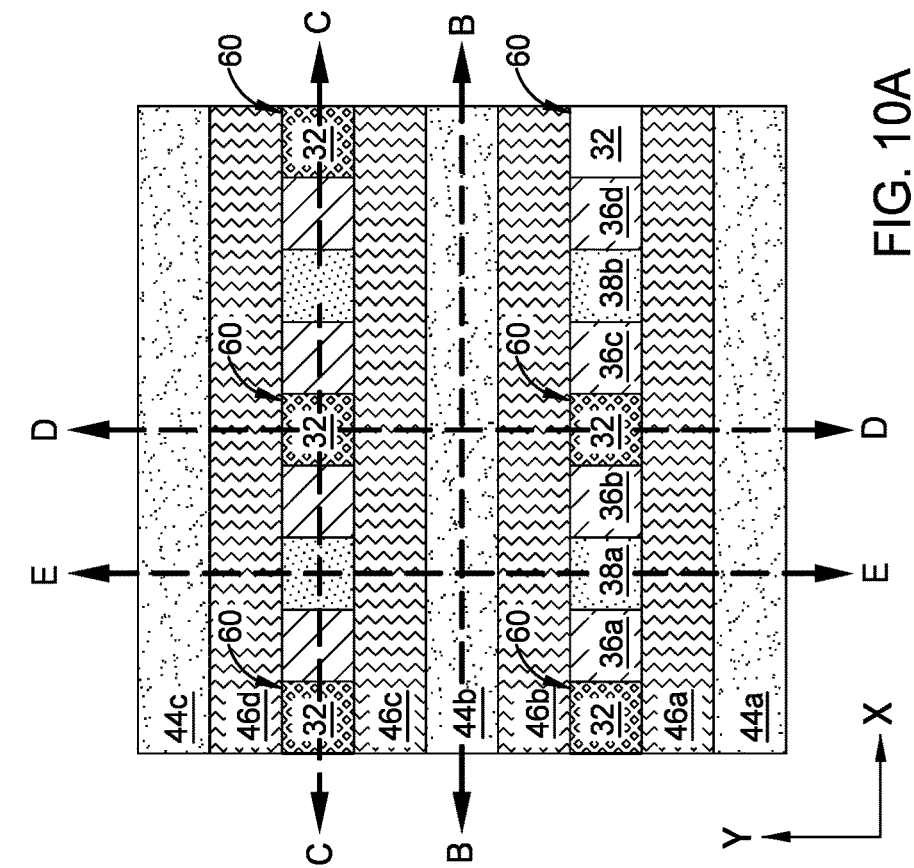
FIG. 10A
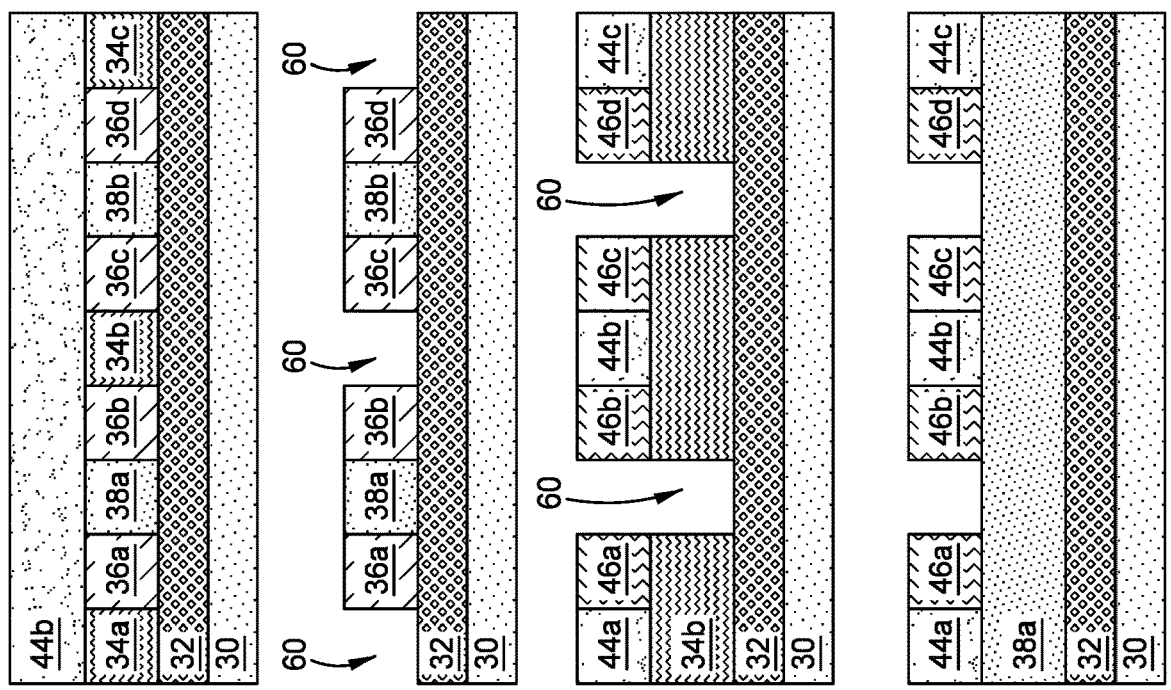
FIG. 10B
FIG. 10C
FIG. 10D
FIG. 10E

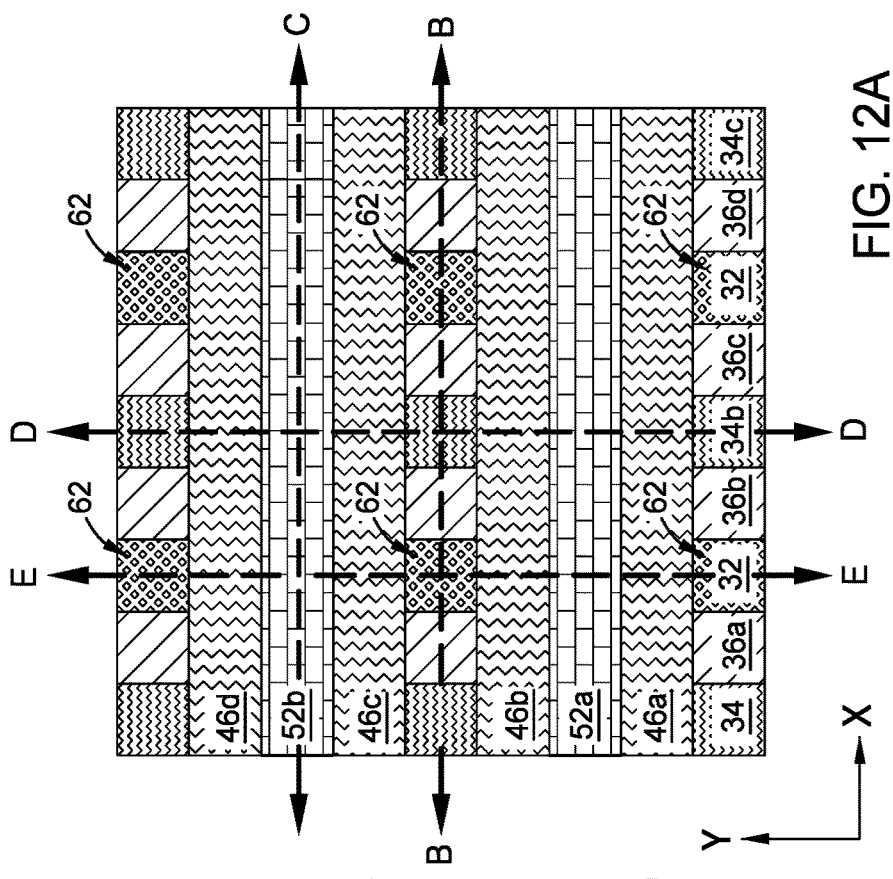
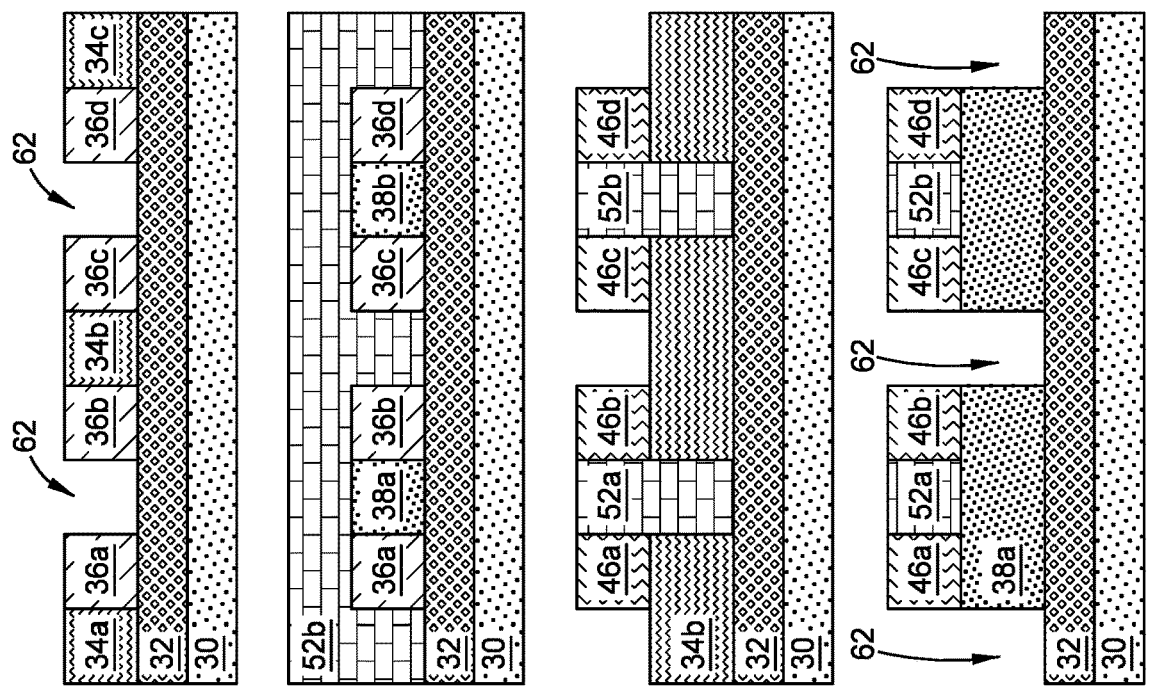
FIG. 12A
FIG. 12B
FIG. 12C
FIG. 12D
FIG. 12E

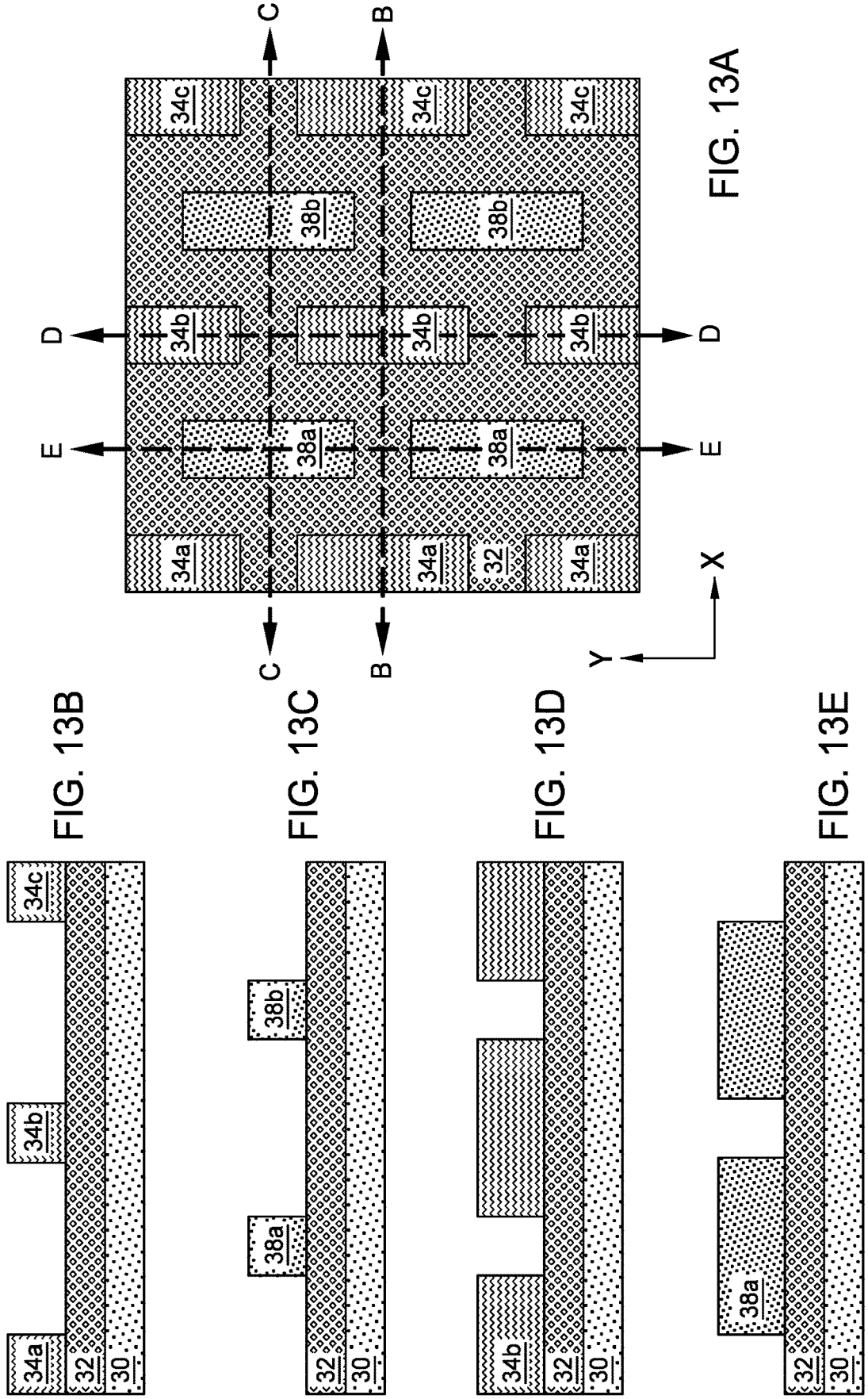

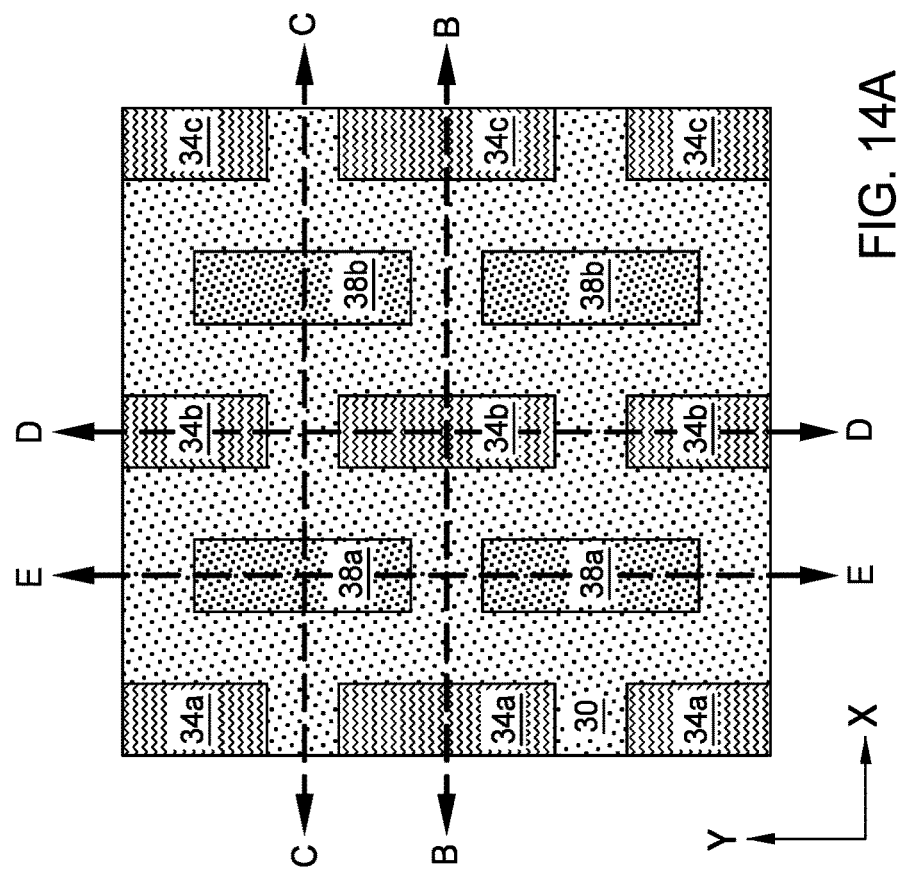
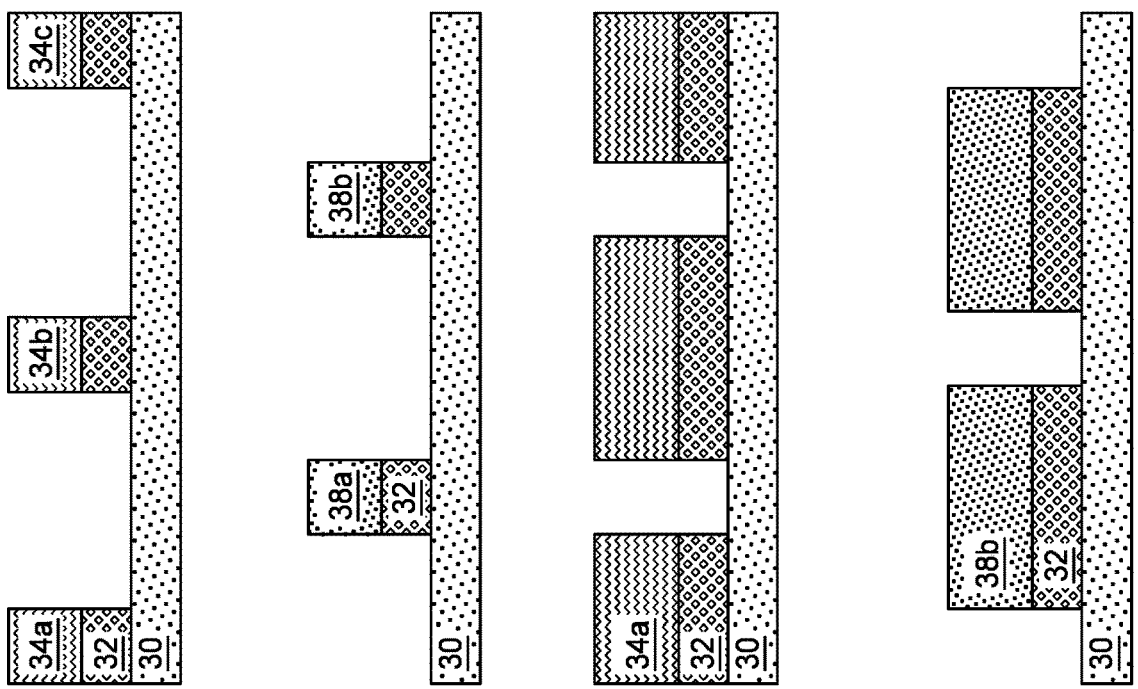
FIG. 14A
FIG. 14B
FIG. 14C
FIG. 14D
FIG. 14E

METHOD FOR FORMING AND PATTERNING A LAYER AND/OR SUBSTRATE

CROSS-REFERENCE TO RELATED APPLICATIONS

This Application is a continuation of U.S. Non-Provisional patent application Ser. No. 16/853,500, filed on Apr. 20, 2020, which claims priority to U.S. Provisional Patent Application No. 62/852,944, filed on May 24, 2019, each of which are herein incorporated by reference in its entirety.

BACKGROUND

Field

Examples of the present disclosure generally relate to forming a layer and patterning features and/or openings in a layer and/or substrate. Particularly, embodiments of the present disclosure provide methods for patterning features and/or openings in a layer and/or substrate with precision dimension control.

Description of the Related Art

Multiple patterning technique is a technology developed for photolithography to enhance the feature density and accuracy. For example, double patterning lithography (DPL) is an effective technique to improve resolution. DPL theoretically doubles resolution through pitch splitting. DPL in some implementations involves two separate exposures and etch steps (litho-etch-litho-etch, or called LELE or L2E2). DPL is particularly suitable for 20 nm generation technology and is one of the promising candidate solutions for scaling down to 14 nm technology and beyond. As the width of features continues to shrink, the aspect ratio (depth divided by width) of the features continues to grow for the stacking of the semiconductor chips in order to improve the feature density. When filling a trench, if the trench is wide and shallow, it is relatively easy to completely fill the trench. However, as the trench aspect ratio increases, it becomes more likely that the opening of the trench will "pinch off", forming a void (e.g., defects) within the trench.

Reliable formation of the gate pattern and shallow trench isolation (STI) regions are important to integrated circuits success. As the requirement for greater circuit density increase, not only must device feature size be reduced, but the size of isolation structures between devices must be reduced along with high aspect ratio requirement. Many different process techniques and material selections have been developed to fill in the trench with the dielectric materials of the isolation structures with minimum defects. Poor process control will result in irregular structure profiles, defects in the trench, or early closure of the trench, resulting in voids or air gap in the trench while filling the trench with the dielectric materials.

SUMMARY

In an embodiment, a method for forming features for semiconductor processing is provided. A first mandrel and a second mandrel are formed on a substrate. A first spacer is formed along a first sidewall of the first mandrel, and a second spacer is formed along a second sidewall of the second mandrel. A gap is defined between the first spacer and the second spacer. The gap is filled by a gap-filling material. The gap-filling material includes a doped silicon material.

In another embodiment, a method for forming features for semiconductor processing is provided. A first mandrel and a second mandrel are formed on a substrate. A first spacer is formed along a first sidewall of the first mandrel, and a second spacer is formed along a second sidewall of the second mandrel. A gap is defined between the first spacer and the second spacer. The first spacer and the second spacer each include a doped silicon material. The gap is filled by a gap-filling material.

In yet another embodiment, a method for forming features for semiconductor processing is provided. A first mandrel and a second mandrel are formed on a substrate. The first mandrel and the second mandrel extend parallel to a first direction along the substrate. A first spacer is formed along a first sidewall of the first mandrel, and a second spacer is formed along a second sidewall of the second mandrel. A first gap is defined between the first spacer and the second spacer. The first gap is filled by a first gap-filling material. At least one of (i) the first spacer and the second spacer, and (ii) the first gap-filling material is boron-doped silicon. A third mandrel and a fourth mandrel are formed on and across the first mandrel, the second mandrel, the first spacer, the second spacer, and the first gap-filling material. The third mandrel and the fourth mandrel extend parallel to a second direction along the substrate that intersects the first direction. A third spacer is formed along a third sidewall of the third mandrel, and a fourth spacer is formed along a fourth sidewall of the fourth mandrel. A second gap is defined between the third spacer and the fourth spacer. A respective portion of (i) the first gap-filling material exposed through the second gap, or (ii) the first mandrel and the second mandrel exposed through the second gap is removed. The second gap is filled by a second gap-filling material. The third mandrel and the fourth mandrel are removed. Respective third gaps are formed by removing the third mandrel and the fourth mandrel. A respective portion of the other of (i) the first gap-filling material exposed through the third gaps, or (ii) the first mandrel and the second mandrel exposed through the third gaps is removed.

BRIEF DESCRIPTION OF THE DRAWINGS

So that the manner in which the above recited features of embodiments of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 1, 2, 3A-3E, 4A-4E, 5A-5E, 6A-6E, 7A-7E, 8A-8E and 9A-9E depict various views of respective structures during a self-aligned multiple patterning (SAMP) process according to some examples.

FIGS. 10A-10E, 11A-11E, 12A-12E, 13A-13E, and 14A-14E depict various views of respective structures during a SAMP process according to some examples.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein provide methods for patterning materials and features in a semiconductor process. Self-aligned multiple patterning (SAMP) processes can be implemented where a desired material can be used as a gap-filling material and/or a material of a spacer. The SAMP process can be used to manufacture nanostructures with desired small dimensions, such as less than 14 nanometers or smaller. The SAMP process can be used to transfer features or patterns into a material layer and/or substrate. In some examples, a gap-filling material implemented in a SAMP process includes a doped silicon material. The doped silicon material may be a Group III, IV, or V doped silicon material, such as boron-doped silicon (Si:B) or carbon-doped silicon (SiC). In some examples, a spacer layer, and spacers subsequently formed from the spacer layer, implemented in a SAMP process includes a doped silicon material. The doped silicon material may be a Group III, IV, or V doped silicon material, such as boron-doped silicon (Si:B).

Various different examples are described below. Although multiple features of different examples may be described together in a process flow or system, the multiple features can each be implemented separately or individually and/or in a different process flow or different system. Additionally, various process flows are described as being performed in an order; other examples can implement process flows in different orders and/or with more or fewer operations.

General processes are described below with reference to various figures. A first general process flow is described in the context of FIGS. 1, 2, and 3A-3E through 9A-9E, and a second general process flow is described in the context of FIGS. 1, 2, 3A-3E through 4A-4E, and 10A-10E through 14A-14E. Various example processing techniques and materials are described in the context of these general process flows. A person having ordinary skill in the art will readily understand various other techniques and materials that may be implemented in other examples. The process flows can be used to pattern any appropriate structure in a layer and/or substrate. In some examples, the process flows are implemented to form patterns for shallow trench isolations (STIs), such as for dynamic random access memory (DRAM), in a substrate.

Figure 1:
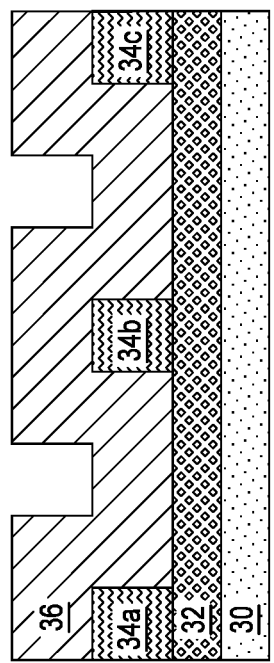

Beginning with the first general process flow, FIG. 1 is a cross sectional view of a structure following formation of mandrels and a spacer layer. The cross-section of FIG. 1 is along an X-direction, which will be shown subsequently in the context of a layout illustration. FIG. 1 depicts a substrate 30, an underlayer 32, first patterned mandrels 34a, 34b, 34c, and a first spacer layer 36. The substrate 30 can include any appropriate semiconductor substrate, such as a bulk substrate, semiconductor-on-insulator (SOI) substrate, or the like. In some examples, the substrate 30 is a bulk silicon wafer. Examples of substrate sizes include 200 mm diameter, 350 mm diameter, 400 mm diameter, and 450 mm diameter, among others. The substrate 30, in some examples, can include any layers and/or structures formed on a semiconductor substrate. For example, dielectric layers, including an interlayer dielectric, an intermetalization dielectric, an etch stop layer, and/or any other dielectric layer, can be formed on the semiconductor substrate, and further, can include any other structure, such as metal lines, vias, gate structures, etc.

The underlayer 32 is disposed on the substrate 30. The underlayer 32 can be any appropriate material that can be used, e.g., as a mask. In some examples, the underlayer 32 is or includes silicon nitride (SiN), silicon oxynitride (SiON), silicon oxide (SiO) which may further be silicon-rich (e.g., a silicon-rich oxide), the like, or a combination thereof. The underlayer 32 can be any appropriate material that provides etch selectivity between the underlayer 32 and appropriate layers that are subsequently formed thereover. The underlayer 32 can be deposited on the substrate 30 using any appropriate deposition process, such as chemical vapor deposition (CVD), spin-on, physical vapor deposition (PVD), or the like.

The first patterned mandrels 34a, 34b, 34c are disposed on the underlayer 32. The first patterned mandrels 34a, 34b, 34c can be formed by depositing a mandrel layer on the underlayer 32 and patterning the mandrel layer into the first patterned mandrels 34a, 34b, 34c. The mandrel layer can be or include a carbon layer, such as a layer of amorphous carbon (a-C), or any other appropriate layer. The mandrel layer can be deposited by CVD, spin-on, or any other appropriate deposition process. The mandrel layer can then be patterned using lithography and etching. A photoresist can be formed on the mandrel layer and patterned using lithography. An etch process, such as an anisotropic etch process like reactive ion etching (RIE), can be performed to transfer the pattern of the photoresist to the mandrel layer to pattern the first patterned mandrels 34a, 34b, 34c.

The first spacer layer 36 is disposed conformally on the first patterned mandrels 34a, 34b, 34c and exposed portions of the underlayer 32. The first spacer layer 36 may be any suitable material different from the first patterned mandrels 34a, 34b, 34c, such as any suitable dielectric material or any suitable silicon-containing material. Examples of suitable material for the first spacer layer 36 include silicon oxide, silicon oxynitride, silicon nitride, amorphous silicon, polysilicon, doped or undoped silicon materials, or the like. In some examples, the first spacer layer 36 may be or include amorphous silicon (a-Si). In some examples, the first spacer layer 36 may be or include silicon oxide (e.g., a low-temperature oxide (LTO)). In some examples, the first spacer layer 36 may be or include a doped silicon material. The doped silicon material may be a Group III, IV, or V doped silicon material, such as boron-doped silicon (Si:B) or carbon-doped silicon (Si:C). In examples where the doped silicon material is boron-doped silicon, a concentration of boron in the boron-doped silicon can be approximately or greater than $10^{20}$ cm$^{-3}$, such as in a range from about $10^{20}$ cm$^{-3}$ to about $10^{23}$ cm$^{-3}$. In such examples of boron-doped silicon, etch selectivity may be provided as a function of the concentration of boron. The first spacer layer 36 can be deposited by any appropriate conformal deposition, such as CVD, plasma-enhanced CVD (PECVD), atomic layer deposition (ALD), or the like.

Figure 2:
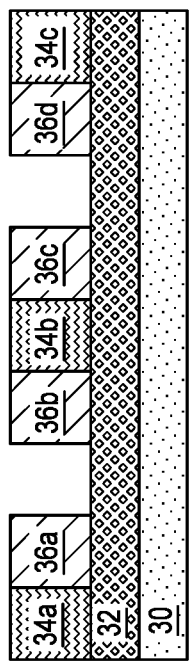

FIG. 2 is a cross sectional view of first spacers 36a, 36b, 36c, 36d disposed on the underlayer 32 and along respective sidewalls of the first patterned mandrels 34a, 34b, 34c. The first spacers 36a, 36b, 36c, 36d are patterned from the first spacer layer 36. For example, the first spacer layer 36 can be anisotropically etched to, e.g., remove horizontal portions of the first spacer layer 36 such that vertical portions of the first spacer layer 36 remain along respective sidewalls of the first patterned mandrels 34a, 34b, 34c. An anisotropic etch process can be an RIE, for example. As shown, a pair of first spacers is disposed along opposing sidewalls of each of the first patterned mandrels 34a, 34b, 34c. For example, first spacer 36b is disposed along a first sidewall of first patterned mandrel 34b, and first spacer 36c is disposed along a second, opposing sidewall of the first patterned mandrel 34b. Further, a gap is defined between opposing first spacers 36a, 36b, 36c, 36d on neighboring first patterned mandrels 34a, 34b, 34c. For example, a gap is defined between first spacers 36a, 36b, and a gap is defined between the first spacers 36c, 36d.

Figure 3A:
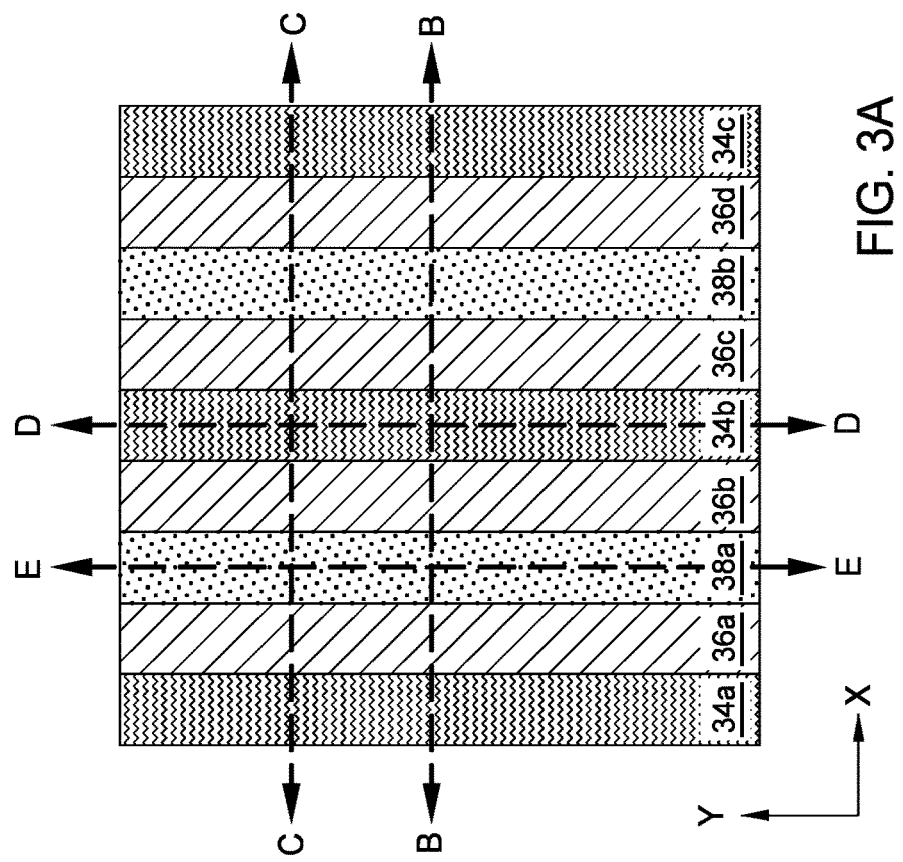
Figure 3B:
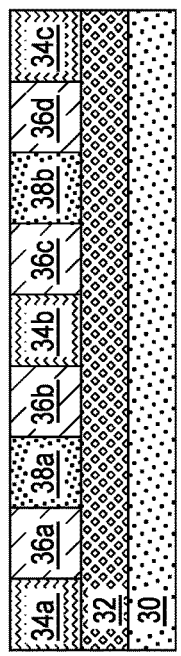
Figure 3C:
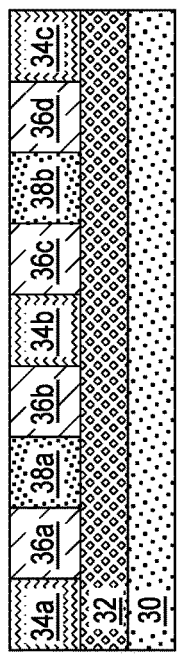
Figure 3D:
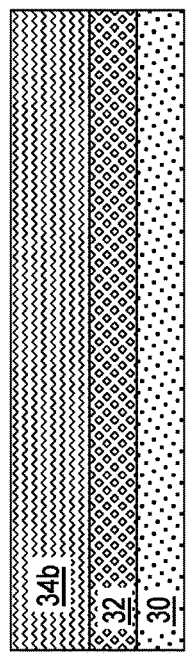
Figure 3E:
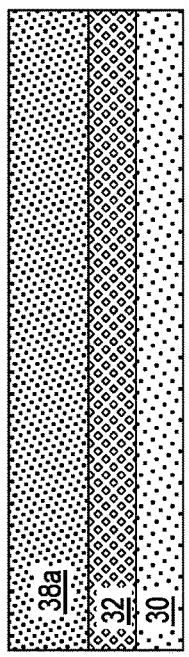
Figures 4A, 4B, 4C, 4D, 4E:
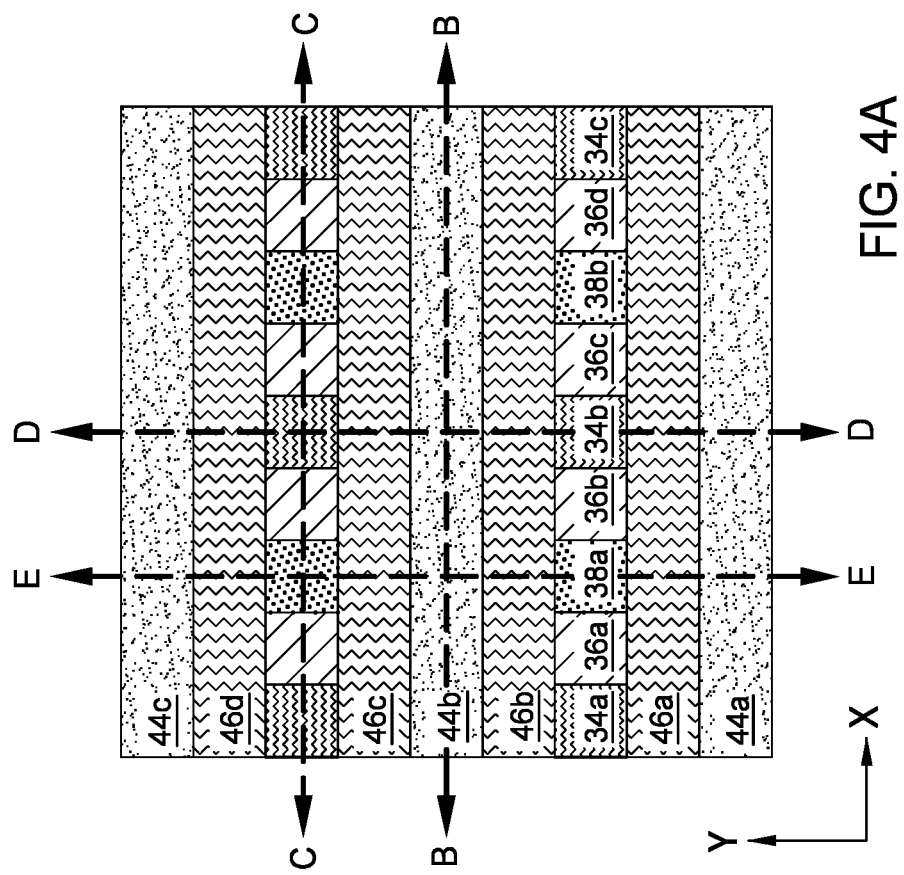
Figure 6A:
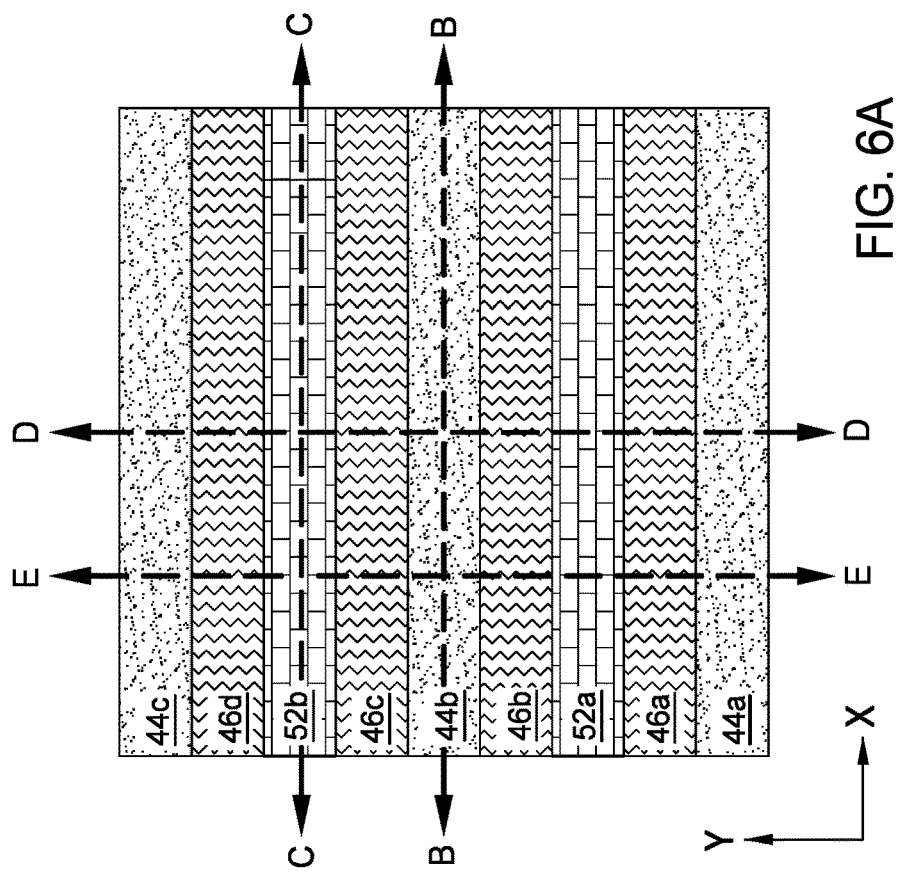
Figure 6B:
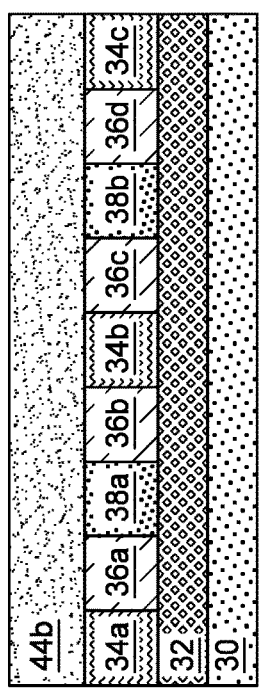
Figure 6C:
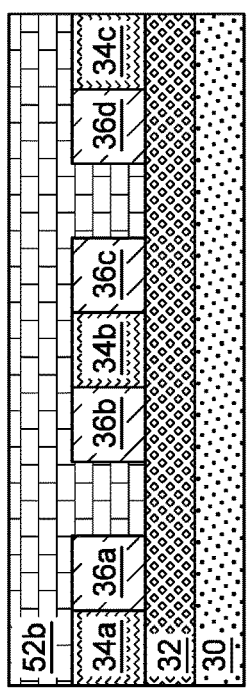
Figure 6D:
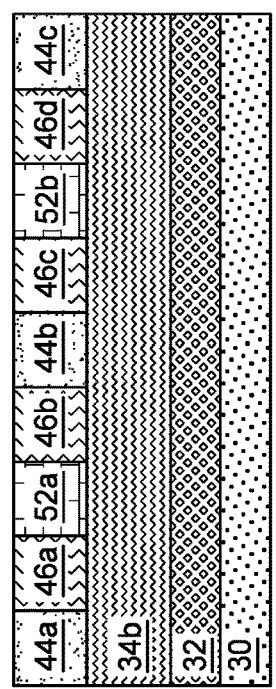
Figure 6E:
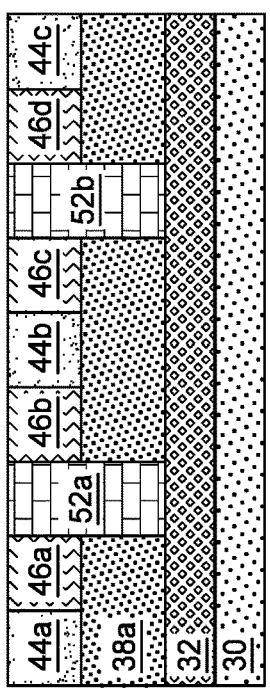
Figure 7A:
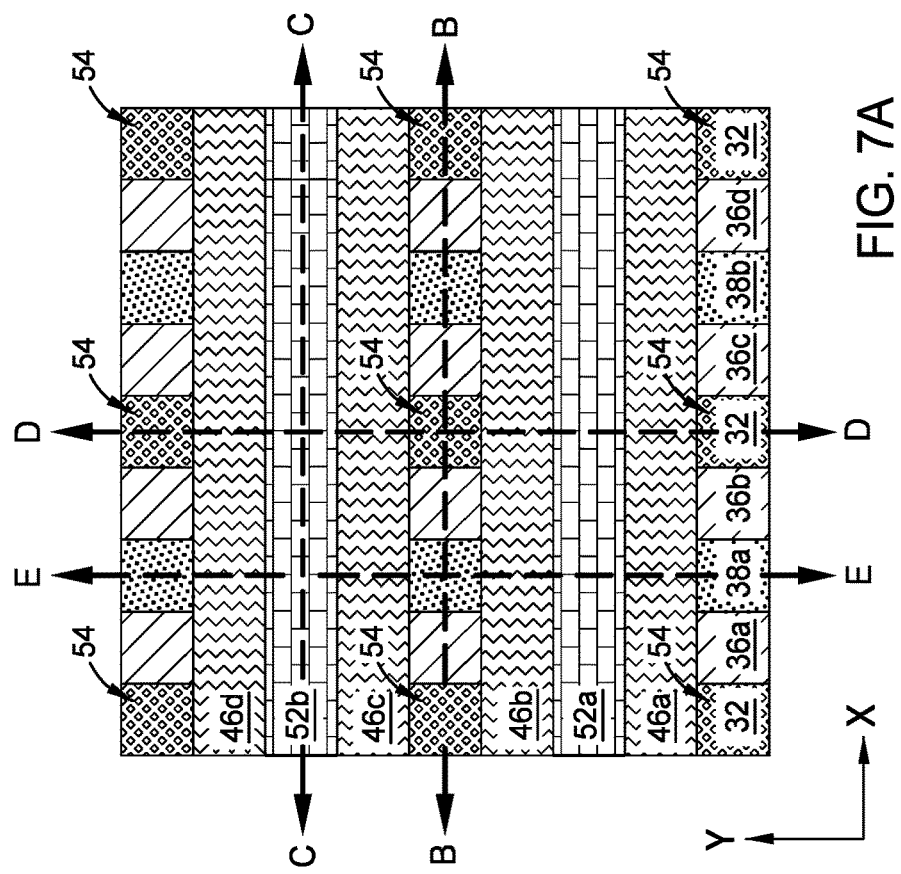
Figure 7B:
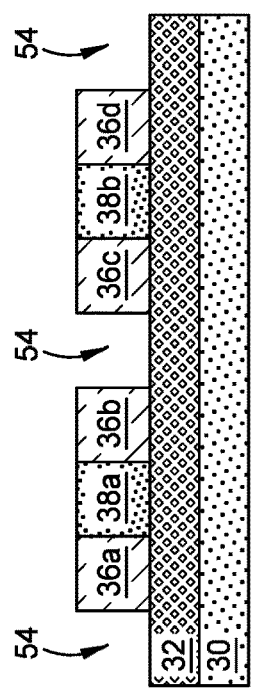
Figure 7C:
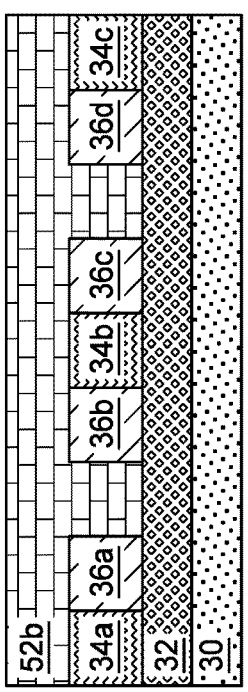
Figure 7D:
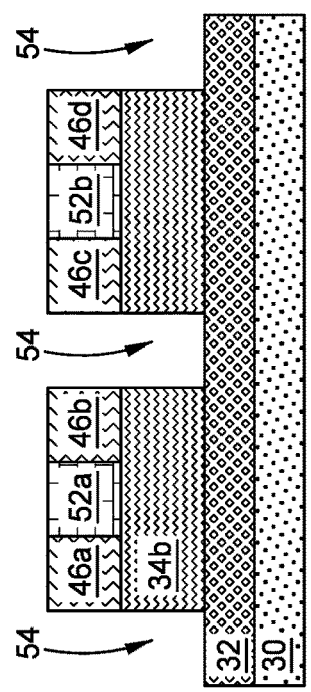
Figure 7E:
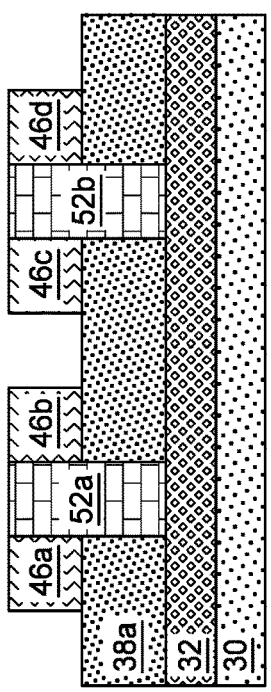
Figure 8A:
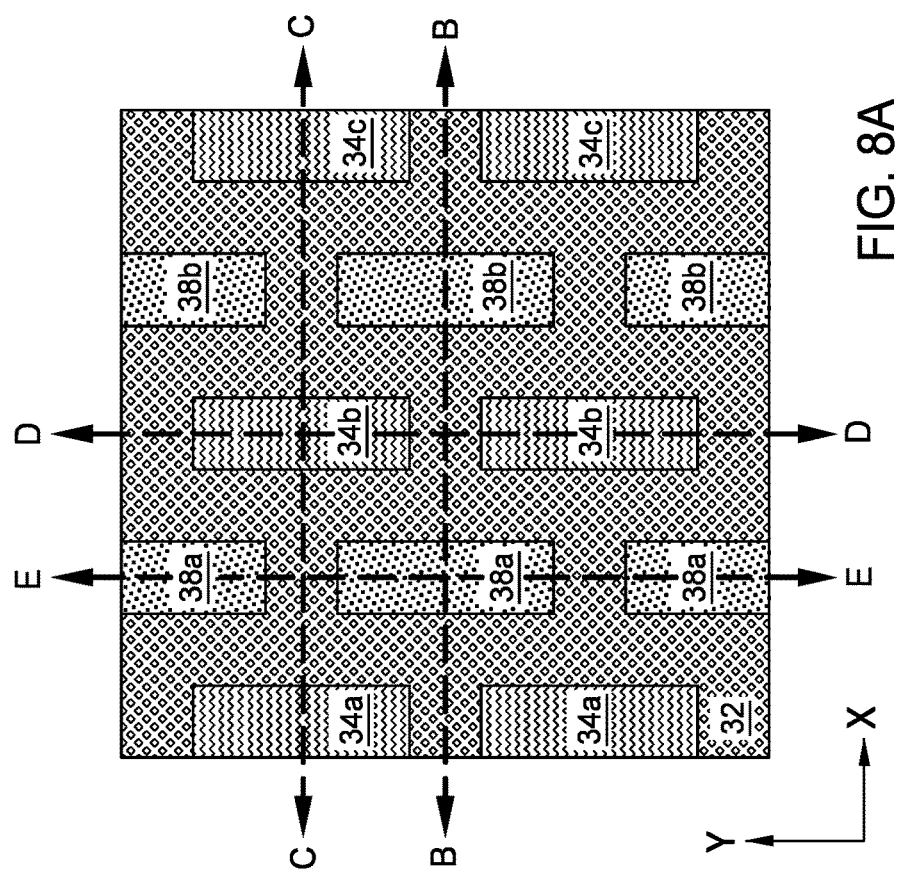
Figure 8B:
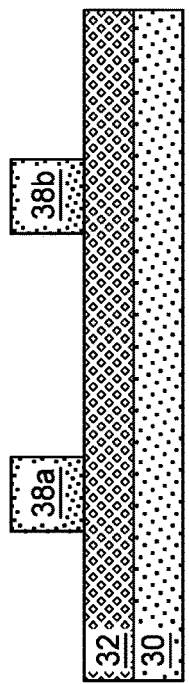
Figure 8C:
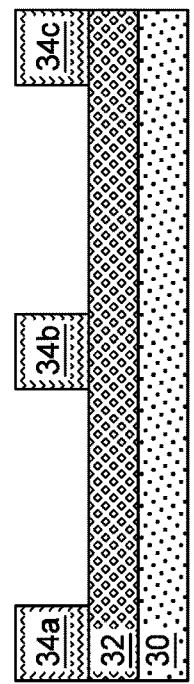
Figure 8D:
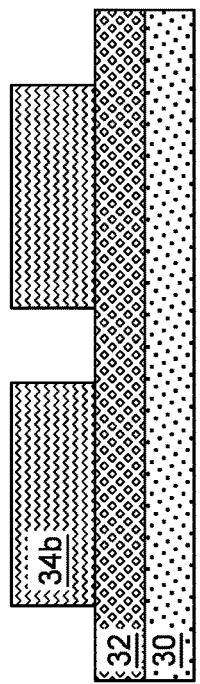
Figure 8E:
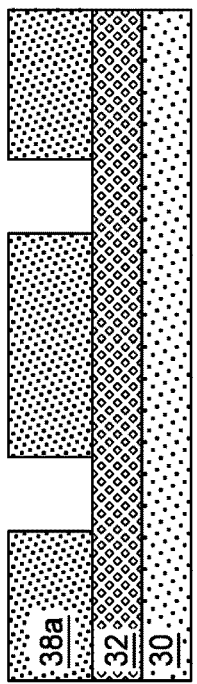
Figure 9A:
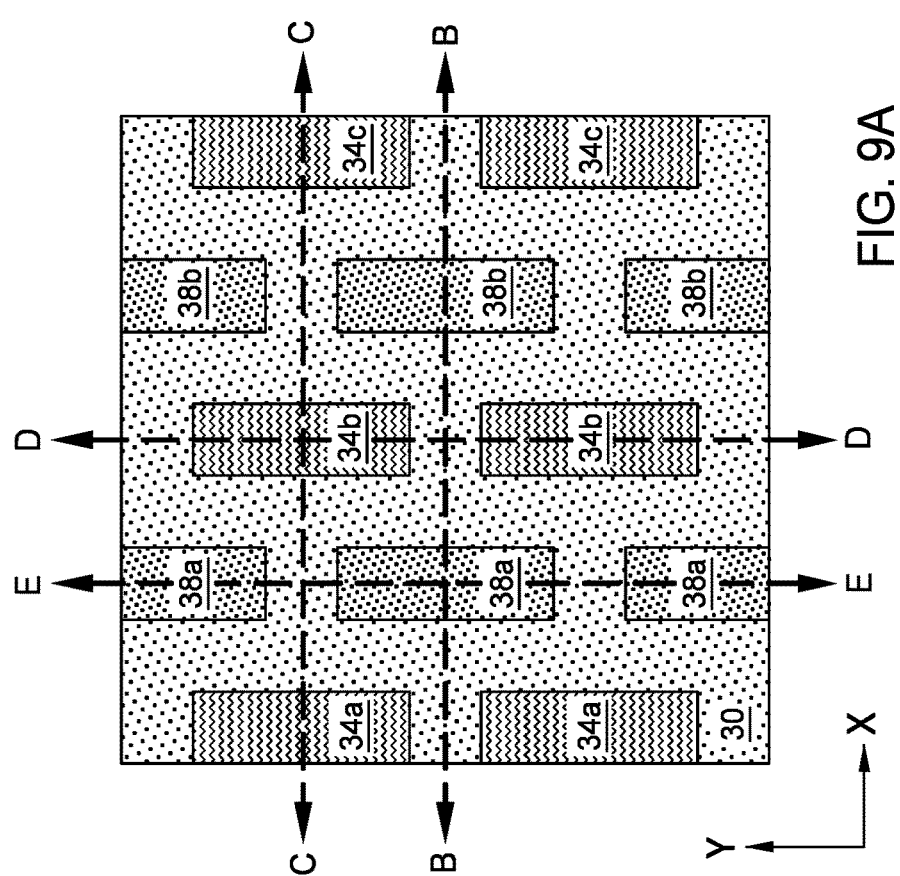
Figure 9B:
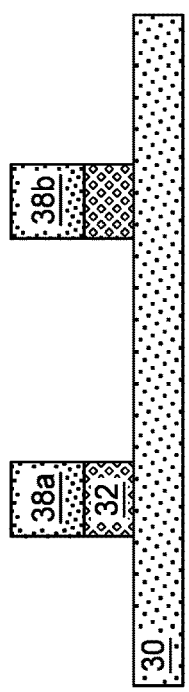
Figure 9C:
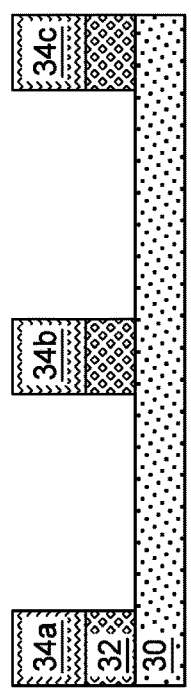
Figure 9D:
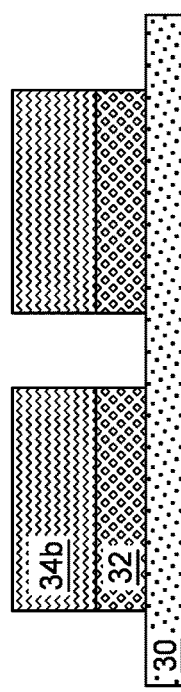
Figure 9E:
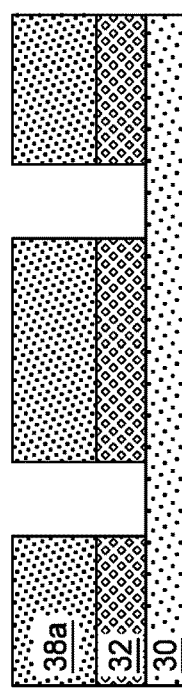
Figure 11A:
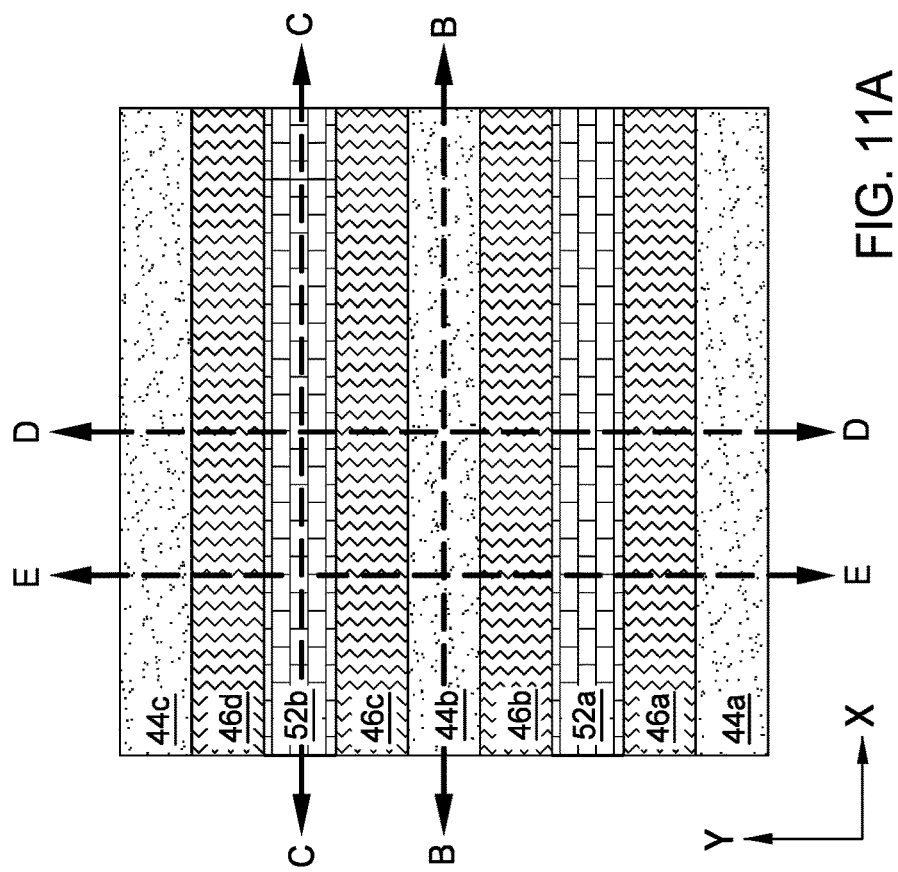
Figure 11B:
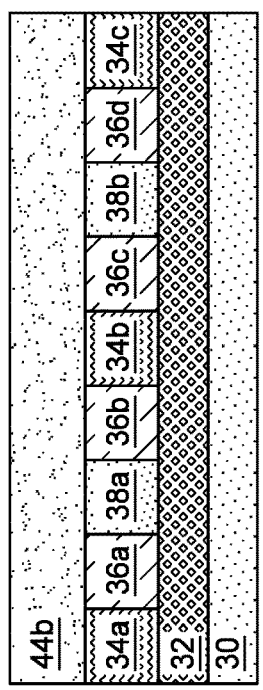
Figure 11C:
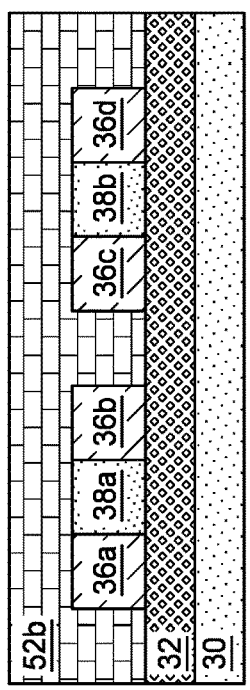
Figure 11D:
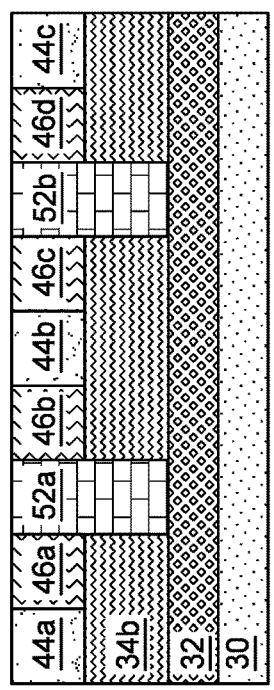
Figure 11E:
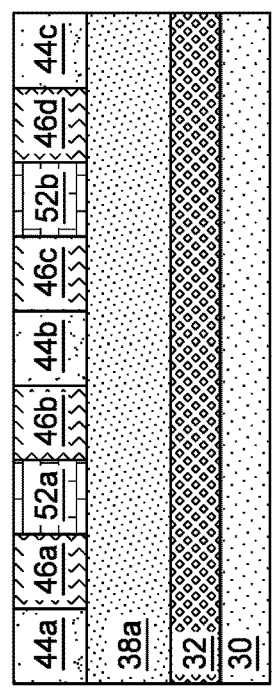

FIGS. 3A, 3B, 3C, 3D, and 3E depict various views after forming a first gap-filling material 38a, 38b in the gaps between first spacers 36a, 36b, 36c, 36d. FIG. 3A is a layout view and depicts cross-sections B-B, C-C at different locations along an X-direction and cross-sections D-D, E-E at different locations along a Y-direction. FIG. 3B is a cross-sectional view of cross-section B-B. FIG. 3C is a cross-sectional view of cross-section C-C. FIG. 3D is a cross-sectional view of cross-section D-D. FIG. 3E is a cross-sectional view of cross-section E-E. Subsequent figures ending in a "B", "C", "D", and "E" designation are likewise along cross-sections B-B, C-C, D-D, and E-E, respectively, of the respective structures. As illustrated in FIG. 3A, the first patterned mandrels 34a, 34b, 34c are patterned to extend along a Y-direction, which intersects the cross-sections B-B, C-C. Following from this patterning of the first patterned mandrels 34a, 34b, 34c, the first spacers 36a, 36b, 36c, 36c and the first gap-filling material 38a, 38b likewise extend along a Y-direction.

The first gap-filling material 38a, 38b is disposed on the underlayer 32 and in gaps between opposing first spacers 36a, 36b, 36c, 36d. The first gap-filling material 38a, 38b can fill gaps between opposing first spacers 36a, 36b, 36c, 36d. A gap-filling material can be deposited in the gaps and on the first spacers 36a, 36b, 36c, 36d and first patterned mandrels 34a, 34b, 34c and, in some cases, subsequently etched-back to form the first gap-filling material 38a, 38b. In some examples, the gap-filling material can include or be a doped silicon material. The doped silicon material may be a Group III, IV, or V doped silicon material, such as boron-doped silicon (Si:B). In examples where the doped silicon material is boron-doped silicon, a concentration of boron in the boron-doped silicon can be approximately or greater than $10^{20}$ cm$^{-3}$, such as in a range from about $10^{20}$ cm$^{-3}$ to about $10^{24}$ cm$^{-3}$. In such examples of boron-doped silicon, etch selectivity may be provided as a function of the concentration of boron. In some examples, the doped silicon material can be or include a carbon-doped silicon material, phosphorus-doped silicon, or other suitable group III, group IV or group V doped silicon material. In some examples, the gap-filling material can be or include carbon-doped silicon or another material. In some examples, the gap-filling material can be or include silicon oxide (e.g., spin-on glass (SOG)). The gap-filling material can be any appropriate material that provides for etch selectivity between the gap-filling material and (1) the first spacers 36a, 36b, 36c, 36d and (2) the first patterned mandrels 34a, 34b, 34c.

The gap-filling material can be deposited by an appropriate deposition process, such as a process that deposits the gap-filling material using a flowing mechanism. Example deposition processes that use a flowing mechanism include flowable CVD (FCVD) and spin-on coating. Other deposition processes may be used. Subsequently, an overburden etch process may be performed to remove any gap-filling material from over the first spacers 36a, 36b, 36c, 36d and first patterned mandrels 34a, 34b, 34c. The overburden etch process can be any appropriate etch process, such as a dry plasma etch process. The first gap-filling material 38a, 38b can therefore be formed with top surfaces of the first gap-filling material 38a, 38b, first spacers 36a, 36b, 36c, 36d, and first patterned mandrels 34a, 34b, 34c being substantially co-planar.

As indicated by the foregoing, in some examples, the first gap-filling material 38a, 38b is a doped silicon material (e.g., boron-doped silicon or carbon-doped silicon), and the first spacers 36a, 36b, 36c, 36d are another, different material, such as a silicon oxide or amorphous silicon. In other examples, the first spacers 36a, 36b, 36c, 36d are a doped silicon material (e.g., boron-doped silicon or carbon-doped silicon), and the first gap-filling material 38a, 38b is another, different material, such as a silicon oxide. It is believed that the doped silicon material may provide good etching selectivity during a subsequent patterning process from the other, different material, which may be silicon oxide or amorphous silicon. The etch selectivity can result in a good profile of the first gap-filling material 38a, 38b after the etch process.

A doped silicon material (e.g., boron-doped silicon) may be deposited at a temperature less than a temperature often used to deposit other silicon containing material, such as non-doped silicon (e.g., amorphous silicon or polysilicon). For example, a doped silicon material (e.g., boron-doped silicon) may be formed by a CVD process with a deposition temperature less than 250 degrees Celsius, such as less than 220 degrees Celsius, and more particularly, such as between about 150 degrees Celsius and about 200 degrees Celsius. The relatively low deposition temperature for the doped silicon material can provide a wider process window for selection and variations of the materials, such as the materials for the first spacers 36a, 36b, 36c, 36d and the first patterned mandrels 34a, 34b, 34c. For example, when the first gap-filling material 38a, 38b is a doped silicon material, the low deposition process temperature allows the first patterned mandrels 34a, 34b, 34c and the first spacers 36a, 36b, 36c, 36d, with which the first gap-filling material 38a, 38b contacts, to be fabricated from a material that can withstand a process at a temperature up to 250 degrees Celsius without substantial material property alternation, film distortion, thermal decomposition (either chemically or physically), and/or different types of changes, where such material might not be able to withstand such processing without such changes at higher temperatures. As a result, some types of carbon materials, polymer materials, organic material, or photoresist materials that often can sustain a temperature less than 250 degrees Celsius, such as above 100 degrees Celsius but less than 250 degrees Celsius, may be selected for the first patterned mandrels 34a, 34b, 34c, for example. Such additional availability of materials may permit enhanced etching selectivity during subsequent etch process(es).

Depositing the gap-filling material with a deposition process that uses a flowing mechanism can provide good gap filling capability that can fill the gaps defined between spacers. For example, FCVD and/or spin-on coating can permit the gap-filling material to fill gaps without substantial seams or voids in the gap-filling material in the gaps defined between spacers. Additionally, a doped silicon material deposited using such a deposition process may further provide good gap filling capability. For example, where the first gap-filling material 38a, 38b is boron-doped silicon with a boron concentration of at least $10^{22}$ cm$^{-3}$, the material of the first spacers 36a, 36b, 36c, 36d is selected to be an amorphous silicon layer to provide a good profile control. When the first gap-filling material 38a, 38b is a carbon doped silicon material, it is believed that the likelihood of forming the certain defects, such as a seam when filling a trench, may be reduced. In some examples, a seamless first gap-filling material 38a, 38b may be filled in the gaps.

FIGS. 4A, 4B, 4C, 4D, and 4E depict the formation of second patterned mandrels 44a, 44b, 44c and second spacers 46a, 46b, 46c, 46d. The second patterned mandrels 44a, 44b, 44c can be formed using processing as described above with respect to the first patterned mandrels 34a, 34b, 34c. The second patterned mandrels 44a, 44b, 44c are patterned to extend in directions that intersect with the respective directions in which the first patterned mandrels 34a, 34b, 34c extend. As illustrated, the second patterned mandrels 44a, 44b, 44c extend in an X-direction, which is perpendicular to the Y-direction in which the first patterned mandrels 34a, 34b, 34c extend. In some examples, the intersecting directions that the first patterned mandrels 34a, 34b, 34c and second patterned mandrels 44a, 44b, 44c extend can be non-perpendicular. The second spacers 46a, 46b, 46c, 46d can be formed using processing as described above with respect to the first spacers 36a, 36b, 36c, 36d. In some examples, the material of the second patterned mandrels 44a, 44b, 44c is or includes silicon nitride (SiN) or the like, and the material of the second spacers 46a, 46b, 46c, 46d is or includes silicon oxide (e.g., LTO), amorphous silicon, or the like. The material of the second patterned mandrels 44a, 44b, 44c can be any material that provides for etch selectivity between the second patterned mandrels 44a, 44b, 44c and (1) the second spacers 46a, 46b, 46c, 46d and (2) the first gap-filling material 38a, 38b. The material of the second spacers 46a, 46b, 46c, 46d can be any material that provides for etch selectivity between the second spacers 46a, 46b, 46c, 46d and (1) the second patterned mandrels 44a, 44b, 44c, (2) the first gap-filling material 38a, 38b, and (3) the first patterned mandrels 34a, 34b, 34c.

FIGS. 5A, 5B, 5C, 5D, and 5E depict the formation of first cuts 50 through the first gap-filling material 38a, 38b. The first cuts 50 can be formed by selectively etching exposed portions of the first gap-filling material 38a, 38b (e.g., which are exposed through gaps between second spacers 46a, 46b, 46c, 46d). The etch process can be an anisotropic etch process, such as a dry plasma etch process like RIE. The underlayer 32 is exposed by the first cuts 50 between neighboring segments of the cut first gap-filling material 38a, 38b.

FIGS. 6A, 6B, 6C, 6D, and 6E depict formation of a second gap-filling material 52a, 52b. The second gap-filling material 52a, 52b is in gaps between opposing second spacers 46a, 46b, 46c, 46d. The second gap-filling material 52a, 52b is further on top surfaces of the first patterned mandrels 34a, 34b, 34c and first spacers 36a, 36b, 36c, 36d and disposed in the first cuts 50 (e.g., on a top surface of the underlayer 32 and along sidewalls of the first gap-filling material 38a, 38b and first spacers 36a, 36b, 36c, 36d that define the first cuts 50). The second gap-filling material 52a, 52b can fill gaps between opposing second spacers 46a, 46b, 46c, 46d. A gap-filling material can be deposited in the gaps and on the second spacers 46a, 46b, 46c, 46d and second patterned mandrels 44a, 44b, 44c and, in some cases, subsequently etched-back to form the second gap-filling material 52a, 52b. In some examples, the gap-filling material can include or be silicon oxide. In some examples, the gap-filling material can include or be silicon, such as amorphous silicon. The gap-filling material can be or include any material that provides etch selectivity between the gap-filling material and (1) the second patterned mandrels 44a, 44b, 44c and (2) the first patterned mandrels 34a, 34b, 34c. The gap-filling material can be deposited by any appropriate deposition process, such as CVD, PVD, spin-on, or the like. In some examples, the gap-filling material is silicon oxide deposited by spin-on (e.g., a spin-on glass (SOG)). Subsequently, an overburden etch process may be performed to remove any gap-filling material from over the second spacers 46a, 46b, 46c, 46d and second patterned mandrels 44a, 44b, 44c. The overburden etch process can be any appropriate etch process, such as a dry plasma etch process. The second gap-filling material 52a, 52b can therefore be formed with top surfaces of the second gap-filling material 52a, 52b, second spacers 46a, 46b, 46c, 46d, and second patterned mandrels 44a, 44b, 44c being substantially co-planar.

FIGS. 7A, 7B, 7C, 7D, and 7E depict the removal of the second patterned mandrels 44a, 44b, 44c and the formation of second cuts 54 through the first patterned mandrels 34a, 34b, 34c. The second patterned mandrels 44a, 44b, 44c can be removed by an etch process. The etch process can be selective to the second patterned mandrels 44a, 44b, 44c. The removal of the second patterned mandrels 44a, 44b, 44c exposes portions of the first patterned mandrels 34a, 34b, 34c, first spacers 36a, 36b, 36c, 36d, and first gap-filling material 38a, 38b between second spacers 46a, 46b, 46c, 46d where the second patterned mandrels 44a, 44b, 44c were removed. The second cuts 54 can then be formed by selectively etching exposed portions of the first patterned mandrels 34a, 34b, 34c (e.g., which are exposed through gaps between second spacers 46a, 46b, 46c, 46d). The etch process can be an anisotropic etch process, such as a dry plasma etch process like RIE. The underlayer 32 is exposed by the second cuts 54 between neighboring segments of the cut first patterned mandrels 34a, 34b, 34c. The removal of the second patterned mandrels 44a, 44b, 44c and formation of second cuts 54 can be by a same continuous etch process or separate etch processes. For example, a same continuous anisotropic etch process selective to the second patterned mandrels 44a, 44b, 44c and the first patterned mandrels 34a, 34b, 34c can be implemented. As another example, an isotropic or anisotropic etch process selective to the second patterned mandrels 44a, 44b, 44c can be performed followed by an anisotropic etch process selective to the first patterned mandrels 34a, 34b, 34c.

FIGS. 8A, 8B, 8C, 8D, and 8E depict the removal of the second spacers 46a, 46b, 46c, 46d, second gap-filling material 52a, 52b, and first spacers 36a, 36b, 36c, 36d. This removal can be by one or more etch processes. For example, materials of the second spacers 46a, 46b, 46c, 46d, second gap-filling material 52a, 52b, and first spacers 36a, 36b, 36c, 36d can be the same or can generally have the same etch selectivity, and hence, the second spacers 46a, 46b, 46c, 46d, second gap-filling material 52a, 52b, and first spacers 36a, 36b, 36c, 36d can be removed by a same, continuous etch process. Where the materials differ, different etch processes can be implemented. The etch process(es) can be isotropic, such as a wet etch process, or can be anisotropic.

In some examples where the second gap-filling material 52a, 52b and the first spacers 36a, 36b, 36c, 36d are a silicon oxide (e.g., SOG and LTO, respectively), a wet etch process using a dilute hydrofluoric acid (dHF), buffered hydrofluoric acid (BHF), and/or buffered oxide etchant (BOE) may be used to remove both the second gap-filling material 52a, 52b and the first spacers 36a, 36b, 36c, 36d. In some examples, an etch solution in such a wet etch process is a mild acid solution. The mild acid solution may gently etch the first spacers 36a, 36b, 36c, 36d without aggressively attacking the other layers, such as the first gap-filling material 38a, 38b (which may be boron-doped silicon or carbon-doped silicon) and the first patterned mandrels 34a, 34b, 34c. The acid solution includes an etchant, such as HF, BOE, and the like. More than one etchant may be used in the etch solution. In an example, the acid solution is at a desired pH level, such as between 3 and 7.

In some examples where the second gap-filling material 52a, 52b is a silicon oxide (e.g., SOG) and the first spacers 36a, 36b, 36c, 36d are amorphous silicon, a wet etch process using dHF may be used to remove the second gap-filling material 52a, 52b, and a wet etch process using ammonium hydroxide (NH$_4$OH), an alkali solution, a alkaline solution, or a combination thereof (such as a mixture of potassium hydroxide (KOH) and NH$_4$OH or a mixture of KOH and an alkali solution) may be used to remove the first spacers 36a, 36b, 36c, 36d. In some examples, an etch solution in such a wet etch process is or includes an alkali or alkaline solution. The alkali or alkaline solution may gently etch the first spacers 36a, 36b, 36c, 36d (e.g., amorphous silicon) without aggressively attacking the other layers, such as the first gap-filling material 38a, 38b (which may be boron-doped silicon or carbon-doped silicon) and the first patterned mandrels 34a, 34b, 34c. An alkali or alkaline solution can include one or more etchants, such as potassium hydroxide (KOH), sodium hydroxide (NaOH), barium hydroxide (Ba(OH)$_2$), and calcium hydroxide (Ca(OH)$_2$, and the like, which may further include NH$_4$OH. The etchants may be dissolved in a deionized water (DI water) at a desired concentration range as to maintain the alkali or alkaline solution at a desired pH level, such as between 7 and 12, for example between about 8 and 11. In an example, the alkali or alkaline solution for the wet etch process contains at least one alkali or alkaline chemical having a concentration between about 0.1 percent (%) and about 60 percent (%) by weight in deionized water. Another agent, such as an oxidizer, buffering compound, or additive, may also be utilized the alkali or alkaline solution.

In some examples where the second gap-filling material 52a, 52b is silicon (e.g., a-Si) and the first spacers 36a, 36b, 36c, 36d are boron-doped silicon, a wet etch process using a solution comprising an alkali or alkaline solution (such as including KOH, NaOH, Ba(OH)$_2$, and Ca(OH)$_2$ may be used to remove the second gap-filling material 52a, 52b, and a wet etch process using a solution comprising an alkali or alkaline solution (such as including KOH, NaOH, Ba(OH)$_2$, and Ca(OH)$_2$ may be used to remove the first spacers 36a, 36b, 36c, 36d.

In a wet etch process of any of the examples described above, the etch solution of the wet etch process may have a solution temperature in a range from about 10° C. to about 100° C., such as around 22.5° C., for example about room temperature. The substrate 30, with the various layers, mandrels, and/or spacers disposed thereon, may be immersed in the etch solution for a time period in a range from about 5 seconds to about 500 seconds, such as from about 10 seconds to about 100 seconds.

The etch solution may be provided in a tank, a sink, a bath, or other suitable container. During the wet etch process, the etch solution may be agitated, stirred, or circulated, which may improve process condition uniformity across the substrate 30. Also, a mega-sonic or ultrasonic power may be applied to the etch solution, which may improve process efficiency. The wet etch process may be continuously performed until desired portions of the first spacers 36a, 36b, 36c, 36d are removed, as shown in FIGS. 8A-8E.

After the removal of the second spacers 46a, 46b, 46c, 46d, second gap-filling material 52a, 52b, and first spacers 36a, 36b, 36c, 36d, the cut segments of the first patterned mandrels 34a, 34b, 34c and first gap-filling material 38a, 38b remain on the underlayer 32. Portions of the underlayer 32 not under the cut segments of the first patterned mandrels 34a, 34b, 34c and first gap-filling material 38a, 38b are exposed.

FIGS. 9A, 9B, 9C, 9D, and 9E depict the transfer of the pattern of the cut segments of the first patterned mandrels 34a, 34b, 34c and first gap-filling material 38a, 38b to the underlayer 32. The transfer of this pattern can be by any appropriate etch process, such as an anisotropic etch process like an RIE. The patterning of the underlayer 32 can be the final target of patterning, or can be the formation of a mask for subsequent transfer of the pattern into the substrate 30.

Table 1 below illustrates materials that may be implemented for various components of the first general process flow according to different examples.

TABLE 1

| | Ex. (1) | Ex. (2) | Ex. (3) | Ex. (4) |
| --- | --- | --- | --- | --- |
| First patterned mandrels 34a-c | a-C | a-C | a-C | a-C |
| First spacers 36a-d | a-Si | SiO (e.g., LTO) | Si:B | a-Si |
| First gap-filling material 38a-b | Si:B | Si:B | SiO (e.g., LTO) | Si:C |
| Second patterned mandrels 44a-c | SiN | SiN | SiN | SiN |
| Second spacers 46a-d | SiO (e.g., LTO) | SiO (e.g., LTO) | a-Si | SiO (e.g., LTO) |
| Second gap-filling material 52a-b | SiO (e.g., SOG) | SiO (e.g., SOG) | a-Si | SiO (e.g., SOG) |

Turning to the second general process flow, processing proceeds as described above with respect to FIGS. 1, 2, 3A-3E, and 4A-4E.

FIGS. 10A, 10B, 10C, 10D, and 10E depict the formation of first cuts 60 through the first patterned mandrels 34a, 34b, 34c. The first cuts 60 can be formed by selectively etching exposed portions of the first patterned mandrels 34a, 34b, 34c (e.g., which are exposed through gaps between second spacers 46a, 46b, 46c, 46d). The etch process can be an anisotropic etch process, such as a dry plasma etch process like RIE. The underlayer 32 is exposed by the first cuts 60 between neighboring segments of the cut first patterned mandrels 34a, 34b, 34c.

FIGS. 11A, 11B, 11C, 11D, and 11E depict formation of a second gap-filling material 52a, 52b. The second gap-filling material 52a, 52b is in gaps between opposing second spacers 46a, 46b, 46c, 46d. The second gap-filling material 52a, 52b is further on top surfaces of the first gap-filling material 38a, 38b and first spacers 36a, 36b, 36c, 36d and disposed in the first cuts 60 (e.g., on a top surface of the underlayer 32 and along sidewalls of the first patterned mandrels 34a, 34b, 34c and first spacers 36a, 36b, 36c, 36d that define the first cuts 60). The second gap-filling material 52a, 52b can fill gaps between opposing second spacers 46a, 46b, 46c, 46d. A gap-filling material can be deposited in the gaps and on the second spacers 46a, 46b, 46c, 46d and second patterned mandrels 44a, 44b, 44c and, in some cases, subsequently etched-back to form the second gap-filling material 52a, 52b. In some examples, the gap-filling material can include or be silicon oxide (e.g. SOG). In some examples, the gap-filling material can include or be doped silicon (e.g., boron-doped silicon or carbon-doped silicon). The gap-filling material can be or include any material that provides etch selectivity between the gap-filling material and (1) the second patterned mandrels 44a, 44b, 44c and (2) the first gap-filling material 38a, 38b, 38c. The gap-filling material can be deposited by any appropriate deposition process, such as CVD, PVD, spin-on, or the like. In some examples, the gap-filling material is silicon oxide deposited by spin-on (e.g., a spin-on glass (SOG)). Subsequently, an overburden etch process may be performed to remove any gap-filling material from over the second spacers 46a, 46b, 46c, 46d and second patterned mandrels 44a, 44b, 44c, like previously described.

FIGS. 12A, 12B, 12C, 12D, and 12E depict the removal of the second patterned mandrels 44a, 44b, 44c and the formation of second cuts 62 through the first gap-filling material 38a, 38b. The second patterned mandrels 44a, 44b, 44c can be removed by an etch process. The etch process can be selective to the second patterned mandrels 44a, 44b, 44c. The removal of the second patterned mandrels 44a, 44b, 44c exposes portions of the first patterned mandrels 34a, 34b, 34c, first spacers 36a, 36b, 36c, 36d, and first gap-filling material 38a, 38b between second spacers 46a, 46b, 46c, 46d where the second patterned mandrels 44a, 44b, 44c were removed. The second cuts 62 can then be formed by selectively etching exposed portions of the first gap-filling material 38a, 38b (e.g., which are exposed through gaps between second spacers 46a, 46b, 46c, 46d). The etch process can be an anisotropic etch process, such as a dry plasma etch process like RIE. The underlayer 32 is exposed by the second cuts 62 between neighboring segments of the cut first gap-filling material 38a, 38b. The removal of the second patterned mandrels 44a, 44b, 44c and formation of second cuts 62 can be by a same continuous etch process or separate etch processes. For example, a same continuous anisotropic etch process selective to the second patterned mandrels 44a, 44b, 44c and the first gap-filling material 38a, 38b can be implemented. As another example, an isotropic or anisotropic etch process selective to the second patterned mandrels 44a, 44b, 44c can be performed followed by an anisotropic etch process selective to the first gap-filling material 38a, 38b.

FIGS. 13A, 13B, 13C, 13D, and 13E depict the removal of the second spacers 46a, 46b, 46c, 46d, second gap-filling material 52a, 52b, and first spacers 36a, 36b, 36c, 36d, like described above. After the removal of the second spacers 46a, 46b, 46c, 46d, second gap-filling material 52a, 52b, and first spacers 36a, 36b, 36c, 36d, the cut segments of the first patterned mandrels 34a, 34b, 34c and first gap-filling material 38a, 38b remain on the underlayer 32. Portions of the underlayer 32 not under the cut segments of the first patterned mandrels 34a, 34b, 34c and first gap-filling material 38a, 38b are exposed.

FIGS. 14A, 14B, 14C, 14D, and 14E depict the transfer of the pattern of the cut segments of the first patterned mandrels 34a, 34b, 34c and first gap-filling material 38a, 38b to the underlayer 32, like described above.

Table 2 below illustrates materials that may be implemented for various components of the second general process flow according to different examples.

TABLE 2

|  | Ex. (1) | Ex. (2) | Ex. (3) | Ex. (4) |
| --- | --- | --- | --- | --- |
| First patterned mandrels 34a-c | a-C | a-C | a-C | a-C |
| First spacers 36a-d | a-Si | SiO (e.g., LTO) | Si:B | a-Si |
| First gap-filling material 38a-b | Si:B | Si:B | SiO (e.g., LTO) | Si:C |
| Second patterned mandrels 44a-c | SiN | SiN | SiN | SiN |

TABLE 2-continued

|  | Ex. (1) | Ex. (2) | Ex. (3) | Ex. (4) |
| --- | --- | --- | --- | --- |
| Second spacers 46a-d | SiO (e.g., LTO) | SiO (e.g., LTO) | a-Si | SiO (e.g., LTO) |
| Second gap-filling material 52a-b | SiO (e.g. SOG) | SiO (e.g. SOG) | Si:B | SiO (e.g., SOG) |

As described, methods for multiple patterning processes to transfer features with small dimensions to a material layer are provided. A gap-filling material that is or includes doped silicon may be utilized to fill in gaps/trenches during the patterning process. Such gap-filling material may be formed in the gaps/trenches without substantial defects, such as voids, formed therein. In some examples, spacers that are or include doped silicon may be utilized during the patterning process. The multiple patterning process utilizes a high etching selectivity process between a spacers and mandrels as well as the gap-filling material so that a desired profile of mandrels and/or spacers and the gap-filling material may be obtained, which may be utilized as mask layer that facilitates the nano-dimension feature transfer process.

Figure 15:
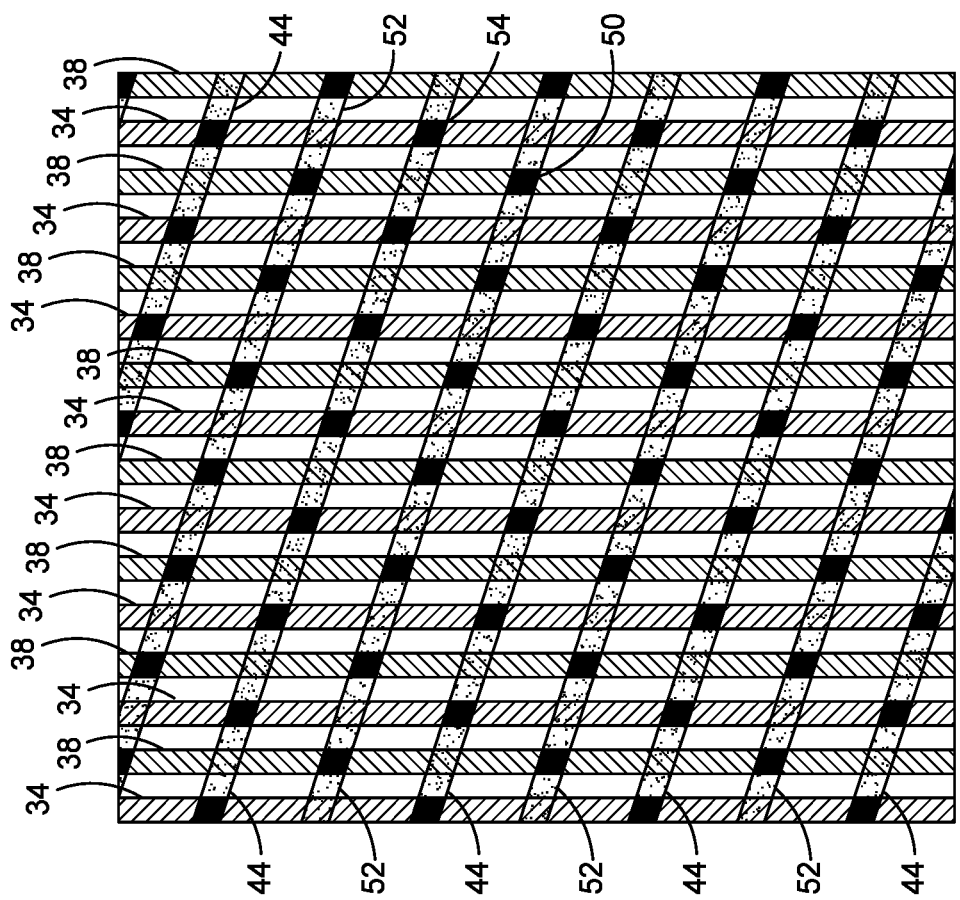
FIG. 15 depicts a layout of a pattern of cut segments of first patterned mandrels and first gap-filling material according to some examples.

FIG. 15 depicts a layout of a pattern of cut segments of first patterned mandrels 34 and first gap-filling material 38. The layout shows alternating first patterned mandrels 34 and first gap-filling material 38 that each extend in a first direction. The layout also shows alternating second patterned mandrels 44 and second gap-filling material 52 that each extend in a second direction that intersects the first direction. A person having ordinary skill in the art will readily understand that a respective first spacer can be between a neighboring first patterned mandrel 34 and first gap-filling material 38, and that a respective second spacer can be between a neighboring second patterned mandrel 44 and second gap-filling material 52. As shown, first cuts 50 of the first gap-filling material 38 are formed where the first gap-filling material 38 intersect (from a layout perspective) with the second gap-filling material 52. Second cuts 54 of the first patterned mandrels 34 are formed where the first patterned mandrels 34 intersect (from a layout perspective) with the second patterned mandrels 44. This pattern may be formed by implementing the first process flow described above that includes FIGS. 5A-5E through 9A-9E.

Although not illustrated, a similar pattern may be formed with cuts at different locations. The first patterned mandrels 34, first gap-filling material 38, second patterned mandrels 44, and second gap-filling material 52 may be disposed as shown in FIG. 15. First cuts 60 of the first patterned mandrels 34 can be formed where the first patterned mandrels 34 intersect (from a layout perspective) with the second gap-filling material 52. Second cuts 62 of the first gap-filling material 38 are formed where the first gap-filling material 38 intersect (from a layout perspective) with the second patterned mandrels 44. This pattern may be formed by implementing the second process flow described above that includes FIGS. 10A-10E through 14A-14E.

While the foregoing is directed to embodiments of the present disclosure, other and further embodiments of the disclosure may be devised without departing from the basic scope thereof, and the scope thereof is determined by the claims that follow.

What is claimed is:
1. A method for forming features for semiconductor processing, the method comprising:
 forming a first mandrel and a second mandrel on a substrate;

forming a first spacer along a first sidewall of the first mandrel;

forming a second spacer along a second sidewall of the second mandrel, a gap being defined between the first spacer and the second spacer;

filling the gap by a gap-filling material, the gap-filling material comprising a doped silicon material different that a material of the first mandrel and the second mandrel, wherein the doped silicon material is boron-doped silicon with a boron concentration between $10^{20}$ cm$^{-3}$ and $10^{24}$ cm$^{-3}$; and selectively removing the first spacer and the second spacer by an etch process, wherein the etch process does not etch the gap-filling material.

2. The method of claim 1, wherein the first mandrel and the second mandrel are each carbon.

3. The method of claim 1, wherein the etch process is a wet etch process.

4. The method of claim 3, wherein the gap is seamlessly filled by the gap-filling material.

5. The method of claim 1, wherein the boron concentration is at least $10^{22}$ cm$^{-3}$.

6. The method of claim 1, wherein the first spacer and the second spacer are each amorphous silicon.

7. The method of claim 6, wherein the wet etch process comprises an etch solution comprising an alkali or alkaline etchant.

8. The method of claim 7, wherein the alkali or alkaline etchant is at least one of KOH, NaOH, Ca(OH)$_2$, and Ba(OH)$_2$.

9. The method of claim 1, wherein the first spacer and the second spacer are each silicon oxide deposited at low temperature.

10. The method of claim 9, wherein the wet etch process comprises an etch solution having an acid etchant.

11. The method of claim 3, wherein the doped silicon material is carbon-doped silicon.

12. The method of claim 11, wherein the carbon-doped silicon is deposited by flowable CVD (FCVD).

13. The method of claim 11, wherein the first spacer and the second spacer are each amorphous silicon.

14. The method of claim 13, wherein the wet etch process comprises an etch solution having an alkali or alkaline etchant.

15. The method of claim 14, wherein the alkali or alkaline etchant is at least one of KOH, NaOH, Ca(OH)$_2$, and Ba(OH)$_2$.

16. The method of claim 1, wherein the boron-doped silicon is formed by a CVD process with a deposition temperature between about 150 degrees Celsius and about 200 degrees Celsius.

17. The method of claim 1, wherein an etch solution of the wet etch process has a solution temperature in a range from about 10° C. to about 100° C.

18. The method of claim 17, wherein the mandrels immersed in the etch solution for a time period in a range from about 10 seconds to about 100 seconds.

19. The method of claim 1, wherein the first spacer and the second spacer are boron-doped silicon.

* * * * *